(12) United States Patent
Mitsui et al.

(10) Patent No.: US 8,436,441 B2
(45) Date of Patent: May 7, 2013

(54) PHOTOELECTRIC CONVERSION DEVICE AND SOLID-STATE IMAGING DEVICE

(75) Inventors: Tetsuro Mitsui, Kanagawa (JP); Daisuke Yokoyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/092,496

(22) Filed: Apr. 22, 2011

(65) Prior Publication Data

US 2011/0233701 A1    Sep. 29, 2011

Related U.S. Application Data

(63) Continuation of application No. 11/520,633, filed on Sep. 14, 2006, now Pat. No. 7,952,156.

(30) Foreign Application Priority Data

Sep. 14, 2005   (JP) ................................ P2005-267138

(51) Int. Cl.
    *H01L 31/0224*    (2006.01)
(52) U.S. Cl.
    USPC .... 257/432; 257/428; 257/431; 257/E31.124; 348/207.99; 348/266; 348/272
(58) Field of Classification Search ...................... 247/40
    See application file for complete search history.

(56) References Cited

U.S. PATENT DOCUMENTS

| | | | |
|---|---|---|---|
| 5,079,595 A * | 1/1992 | Suzuki et al. .................. | 257/40 |
| 5,343,061 A | 8/1994 | Yamashita et al. | |
| 5,923,049 A | 7/1999 | Bohm et al. | |
| 5,965,875 A | 10/1999 | Merrill | |
| 6,080,998 A | 6/2000 | Shima et al. | |
| 6,081,018 A | 6/2000 | Nakashiba et al. | |
| 6,198,091 B1 | 3/2001 | Forrest et al. | |
| 6,252,286 B1 | 6/2001 | Arai | |
| 6,391,471 B1 | 5/2002 | Hiraoka et al. | |
| 6,545,331 B1 | 4/2003 | Miida | |
| 6,632,701 B2 | 10/2003 | Merrill | |
| 6,653,701 B1 | 11/2003 | Yamazaki et al. | |

(Continued)

FOREIGN PATENT DOCUMENTS

| | | |
|---|---|---|
| JP | 5-335544 A | 12/1993 |
| JP | 6-332200 A | 12/1994 |

(Continued)

OTHER PUBLICATIONS

Japanese Office Action issued in Application No. 2005-267138, dated Aug. 24, 2010.

(Continued)

*Primary Examiner* — Wai Sing Louie
*Assistant Examiner* — William Harriston
(74) *Attorney, Agent, or Firm* — Sughrue Mion, PLLC

(57) ABSTRACT

A photoelectric conversion device comprising a photoelectric conversion part including a first electrode layer, a second electrode layer and a photoelectric conversion layer provided between the first electrode layer and the second electrode layer, wherein light is made incident from an upper part of the second electrode layer into the photoelectric conversion layer; the photoelectric conversion layer generates a charge containing an electron and a hole corresponding to the incident light from the upper part of the second electrode layer; and the first electrode layer works as an electrode for extracting the hole.

10 Claims, 8 Drawing Sheets

U.S. PATENT DOCUMENTS

| | | | |
|---|---|---|---|
| 6,713,796 B1 | 3/2004 | Fox | |
| 6,740,807 B2 | 5/2004 | Ono | |
| 6,750,523 B2 | 6/2004 | Blanchard | |
| 6,821,809 B2 | 11/2004 | Abe et al. | |
| 7,109,409 B2 | 9/2006 | Chu | |
| 7,129,466 B2 | 10/2006 | Iwasaki | |
| 7,180,110 B2 | 2/2007 | Komatsu et al. | |
| 7,213,984 B2 | 5/2007 | Kaneiwa et al. | |
| 7,247,346 B1 | 7/2007 | Sager et al. | |
| 7,268,369 B2 | 9/2007 | Araki | |
| 7,291,515 B2 | 11/2007 | Araki | |
| 7,410,906 B2 | 8/2008 | Araki | |
| 7,411,620 B2 | 8/2008 | Taniguchi et al. | |
| 7,419,314 B2 | 9/2008 | Kaneiwa et al. | |
| 7,879,733 B2 * | 2/2011 | Eun | 438/723 |
| 7,920,189 B2 * | 4/2011 | Goto | 348/273 |
| 7,929,036 B2 * | 4/2011 | Miyamoto et al. | 348/311 |
| 7,932,574 B2 * | 4/2011 | Kanbe | 257/431 |
| 7,952,156 B2 * | 5/2011 | Mitsui et al. | 257/435 |
| 7,998,778 B2 * | 8/2011 | Kanbe et al. | 438/59 |
| 8,008,108 B2 * | 8/2011 | Kanbe et al. | 438/59 |
| 8,203,194 B2 * | 6/2012 | Kim | 257/431 |
| 2001/0000005 A1 | 3/2001 | Forrest et al. | |
| 2001/0013898 A1 | 8/2001 | Bawolek et al. | |
| 2002/0092992 A1 | 7/2002 | Izumi | |
| 2003/0189656 A1 | 10/2003 | Shinohara | |
| 2003/0209651 A1 | 11/2003 | Iwasaki | |
| 2005/0087829 A1 | 4/2005 | Merrill et al. | |
| 2005/0205903 A1 * | 9/2005 | Hioki | 257/291 |
| 2005/0263183 A1 * | 12/2005 | Nishikitani et al. | 136/263 |
| 2006/0108578 A1 | 5/2006 | Liu | |
| 2007/0045520 A1 * | 3/2007 | Mitsui | 250/214 R |
| 2007/0057339 A1 * | 3/2007 | Mitsui et al. | 257/432 |
| 2007/0090376 A1 | 4/2007 | Kumaki et al. | |
| 2007/0181912 A1 | 8/2007 | Ikeda et al. | |
| 2008/0067530 A1 | 3/2008 | Forrest et al. | |
| 2008/0284325 A1 | 11/2008 | Noh et al. | |
| 2009/0283758 A1 * | 11/2009 | Nomura et al. | 257/40 |

FOREIGN PATENT DOCUMENTS

| | | |
|---|---|---|
| JP | 07-038136 | 2/1995 |
| JP | 11-052352 A | 2/1999 |
| JP | 2002-162474 A | 6/2002 |
| JP | 2003-288993 A | 10/2003 |
| JP | 2003-332551 A | 11/2003 |
| JP | 2004-165242 A | 6/2004 |
| JP | 2004-356229 A | 12/2004 |
| JP | 2005-175131 A | 6/2005 |
| JP | 2007-12982 A | 1/2007 |

OTHER PUBLICATIONS

Notification of Reasons for Rejection, dated Feb. 26, 2013, issued in counterpart JP Application No. 2011-173227, 7 pages in English and Japanese.

* cited by examiner

PHOTOELECTRIC CONVERSION DEVICE AND SOLID-STATE IMAGING DEVICE

CROSS REFERENCE TO RELATED APPLICATIONS

This is a Continuation of U.S. patent application Ser. No. 11/520,633, filed on Sep. 14, 2006, which claims priority from Japanese Patent Application No. P2005-267138 filed Sep. 14, 2005, the disclosures of which are incorporated herein by reference in their entirety.

FIELD OF THE INVENTION

The present invention relates to a photoelectric conversion device including a photoelectric conversion part containing a first electrode layer, a second electrode layer opposing to the first electrode layer and a photoelectric conversion layer disposed between the first electrode layer and the second electrode layer and to a solid-state imaging device in which a plural number of this photoelectric conversion device is disposed in an array state.

BACKGROUND OF THE INVENTION

With respect to optical sensors of the related art, a device which is prepared by forming a photodiode (PD) in semiconductor substrate such as silicon (Si) is general. As a solid-state imaging device, there is widely employed a planar solid-state imaging device in which PDs are two-dimensionally arranged in a semiconductor substrate and a signal corresponding to a signal charge as generated from each PD by photoelectric conversion is read out by a CCD or CMOS circuit. As a method of realizing a color solid-state imaging device, a structure in which color filters each of which is able to transmit only light having a specific wavelength therethrough are arranged for the color separation in a side of the light incident face of a planar solid-state imaging device is general. In particular, as a system which is widely employed at present for digital cameras and so on, there is well known a single solid-state imaging device in which color filters which are able to transmit blue (B) light, green (G) light and red (R) light, respectively therethrough are regularly arranged on respective two-dimensionally arranged PDs.

However, in the single solid-state imaging device, since the color filter transmits only light of a limited wavelength therethrough, light which has not transmitted through the color filter is not utilized, and the use efficiency of light is poor. Also, with progress of high integration of pixel, the size of PD becomes the same in size as the wavelength of light, whereby the light is hardly waveguided into PD. Also, since blue light, green light and red light are detected by separate PDs adjacent to each other and then subjected to arithmetic processing, thereby achieving color reproduction, a false color may possibly be generated. In order to avoid this false color, an optical low-pass filter is necessary, resulting in the generation of an optical loss by this filter.

There have hitherto been reported color sensors in which three PDs are stacked within a silicon substrate by utilizing the wavelength dependency of an absorption coefficient of silicon and color separation is carried out due to a difference in depth on the pn junction face of each PD (U.S. Pat. No. 5,965,875, U.S. Pat. No. 6,632,701 and JP-A-7-38136). However, such a system involves a problem that the wavelength dependency of spectral sensitivity in the stacked PDs is broad so that the color separation is insufficient. In particular, the color separation between blue and green colors is insufficient.

In order to solve this problem, there is proposed a sensor in which a photoelectric conversion part which detects green light and generates a signal charge corresponding thereto is provided in an upper part of a silicon substrate and blue light and red light are detected by two PDs as stacked within the silicon substrate (see JP-A-2003-332551). The photoelectric conversion part which is provided in the upper part of the silicon substrate is configured to include a first electrode layer as stacked on the silicon substrate, a photoelectric conversion layer which is made of an organic material as stacked on the first electrode layer and a second electrode layer as stacked on the photoelectric conversion layer. This photoelectric conversion part is configured such that when a voltage is applied to the first electrode layer and the second electrode layer, a signal charge as generated within the photoelectric conversion layer transfers into the first electrode layer and the second electrode layer and a signal corresponding to the signal charge as transferred into either one of the electrode layers is read out by a CCD or CMOS circuit or the like as provided within the silicon substrate. In this specification, the "photoelectric conversion layer" as referred to herein means a layer capable of absorbing incident light having a specific wavelength which has been made incident thereinto and generating an electron and a hole corresponding to the quantity of absorbed light.

SUMMARY OF THE INVENTION

In the photoelectric conversion layer made of an organic material, it is general that in the foregoing configuration, when light is made incident from the upper part of the second electrode layer, an electron and a hole are generated in large amounts in the vicinity of the second electrode layer due to the light absorption, whereas an electron and a hole are not generated in such large amounts in the vicinity of the first electrode layer. This is caused due to the matter that a major part of light in the vicinity of the absorption peak wavelength of this photoelectric conversion layer is absorbed in the vicinity of the second electrode layer and that when it becomes more distant from the vicinity of the second electrode layer, an absorptance of light is lowered. For that reason, so far as an electron or a hole as generated in the vicinity of the second electrode layer does not efficiently transfer into the silicon substrate, the photoelectric conversion efficiency is lowered, resulting in a lowering of the sensitivity of the device. Also, a signal due to the light wavelength as strongly absorbed in the vicinity of the second electrode layer is reduced, resulting in so-called broadening such that the width of the spectral sensitivity is widened.

Also, in the photoelectric conversion layer made of an organic material, it is general that the mobility of the electron is very small as compared with that of the hole. In addition, in the photoelectric conversion layer made of an organic material, it is known that the mobility of the electron is likely influenced by oxygen and that when the photoelectric conversion layer is exposed in the air, the mobility of the electron is further lowered. For that reason, in the case where it is intended to transfer the electron into the silicon substrate, if the transfer distance of the electron as generated in the vicinity of the second electrode layer within the photoelectric conversion layer is long, the electron is not collected by the electrode layer by, for example, the matter that a part of the electron is deactivated during the transfer, resulting in a lowering of the sensitivity and broadening of the spectral sensitivity.

In order to prevent the foregoing lowering of the sensitivity and broadening of the spectral sensitivity from occurring, it is thought as a countermeasure thereto to make the photoelectric conversion layer thin or to use a material having a high mobility of the electron. However, since it is necessary to obtain a sufficient amount of the light absorption, there is a limit in making the thickness of the photoelectric conversion layer thin; and if it is intended to meet the requirements regarding the mobility, there is a demerit that the material is largely limited. Also, in order to assist the slow mobility of the electron, it is possible to apply an electric field to the photoelectric conversion layer. However, in the case of applying a sufficiently strong electric field, there is some possibility of causing a lowering of S/N of a sensor such as an increase of an injective leak current from the two electrodes interposing the photoelectric conversion layer therebetween. For that reason, there is demanded a measure of preventing a lowering of the sensitivity and broadening of the spectral sensitivity from occurring without employing the foregoing methods.

For the purpose of preventing a lowering of the sensitivity and broadening of the spectral sensitivity from occurring, it is effective to efficiently transfer an electron or a hole as generated in the vicinity of the second electrode layer into a charge storage/transfer/read-out (silicon) substrate. In order to realize this, how to treat an electron or a hole as generated within the photoelectric conversion layer is a problem.

Under the foregoing circumstances, the invention has been made. An object of the invention is to provide a photoelectric conversion device which is able to prevent a lowering of the sensitivity and broadening of the spectral sensitivity from occurring.

The photoelectric conversion device of the invention is a photoelectric conversion device including a photoelectric conversion part containing a first electrode layer, a second electrode layer opposing to the first electrode layer and a photoelectric conversion layer disposed between, the first electrode layer and the second electrode layer, wherein light is made incident from an upper part of the second electrode layer into the photoelectric conversion layer; the photoelectric conversion layer generates a charge containing an electron and a hole corresponding to the incident light from the upper part of the second electrode layer; and the first electrode layer works as an electrode for extracting the hole.

In the photoelectric conversion device of the invention, the photoelectric electrode layer is configured to contain an organic material.

In the photoelectric conversion device of the invention, the photoelectric conversion layer generates the electron and the hole in larger amounts in the vicinity of the second electrode layer than those in the vicinity of the first electrode layer.

In the photoelectric conversion device of the invention, the organic material contains at least one of an organic p-type semiconductor and an organic n-type semiconductor.

In the photoelectric conversion device of the invention, the organic p-type semiconductor and the organic n-type semiconductor each contains any one of quinacridone derivatives, naphthalene derivatives, anthracene derivatives, phenanthrene derivatives, tetracene derivatives, pyrene derivatives, perylene derivatives, and fluoranthene derivatives.

In the photoelectric conversion device of the invention, the first electrode layer is made of ITO, IZO, $ZnO_2$, $SnO_2$, $TiO_2$, FTO, Al, Ag, or Au.

In the photoelectric conversion device of the invention, the second electrode layer is made of ITO, IZO, $ZnO_2$, $SnO_2$, $TiO_2$, FTO, Al, Ag, or Au.

In the photoelectric conversion device of the invention, the second electrode layer is made of ITO, IZO, $ZnO_2$, $SnO_2$, $TiO_2$, or FTO; and the photoelectric conversion part contains a layer made of a metal having a work function of not more than 4.5 eV between the photoelectric conversion layer and the second electrode layer.

In the photoelectric conversion device of the invention, the second electrode layer has a light transmittance to visible light of 60% or more.

In the photoelectric conversion device of the invention, the first electrode layer has a light transmittance to visible light of 60% or more.

In the photoelectric conversion device of the invention, the first electrode layer and the second electrode layer are applied with a voltage such that the electron transfers into the second electrode layer and that the hole transfers into the first electrode layer; and a semiconductor substrate provided in a lower part of the first electrode layer, a hole storage part for storing the hole as transferred into the first electrode layer, which is formed within the semiconductor substrate, and a connecting part for electrically connecting the hole storage part to the first electrode layer are provided.

In the photoelectric conversion device of the invention, the photoelectric conversion part contains a layer made of an organic high molecular weight material (organic polymer material) between the first electrode layer and the photoelectric conversion layer.

In the photoelectric conversion device of the invention, an in-substrate photoelectric conversion part capable of absorbing light which has transmitted through the photoelectric conversion layer, generating a charge corresponding to the light and storing the charge is provided within the semiconductor substrate in a lower part of the photoelectric conversion layer.

In the photoelectric conversion device of the invention, the in-substrate photoelectric conversion part is made of plural photodiodes which are stacked within the semiconductor substrate and which are able to absorb light of a different color, respectively.

In the photoelectric conversion device of the invention, the in-substrate photoelectric conversion part is made of plural photodiodes which are arranged in a direction vertical to an incident direction of the incident light within the semiconductor substrate and which are able to absorb light of a different color, respectively.

In the photoelectric conversion device of the invention, the plural photodiodes are a photodiode for blue color in which a pn junction face is formed in a position capable of absorbing blue light and a photodiode for red color in which a pn junction face is formed in a position capable of absorbing red light; and the photoelectric conversion layer absorbs green light.

In the photoelectric conversion device of the invention, the plural photodiodes are a photodiode for blue color capable of absorbing blue light and a photodiode for red color capable of absorbing red light; and the photoelectric conversion layer absorbs green light.

In the photoelectric conversion device of the invention, a plural number of the photoelectric conversion part is stacked in an upper part of the semiconductor substrate; and the hole storage part and the connecting part are provided in every one of the plural photoelectric conversion parts.

In the photoelectric conversion device of the invention, an inorganic photoelectric conversion part which is made of an inorganic material capable of absorbing light which has transmitted through the first electrode layer, generating a charge corresponding to the light and storing the charge is provided between the semiconductor substrate and the first electrode layer located closest to the semiconductor substrate.

The solid-state imaging device of the invention is a solid-state imaging device including a plural number of the foregoing photoelectric conversion device as disposed in an array state, wherein a signal read-out part for reading out a signal corresponding to the charge as stored within the semiconductor substrate of each of the plural photoelectric conversion devices is provided.

The solid-state imaging device of the invention is a solid-state imaging device including a plural number of the foregoing photoelectric conversion device as disposed in an array state, wherein a signal read-out part for reading out a signal corresponding to the charge as stored within the semiconductor substrate of each of the plural photoelectric conversion devices and a signal corresponding to the charge as stored in the inorganic photoelectric conversion part is provided.

In the solid-state imaging device of the invention, the signal read-out part is configured of an MOS transistor.

In the solid-state imaging device of the invention, the photoelectric conversion layer and the second electrode layer which are contained in the photoelectric conversion device are made common in the whole of the plural photoelectric conversion devices; and the first electrode layer which is contained in the photoelectric conversion device is separated for every one of the plural photoelectric conversion devices.

According to the invention, it is possible to provide a photoelectric conversion device which is able to prevent a lowering of the sensitivity and broadening of the spectral sensitivity from occurring.

DETAILED DESCRIPTION OF THE INVENTION

The embodiments of the invention will be hereunder described with reference to the accompanying drawings.

The present applicant has found that in a photoelectric conversion device including a photoelectric conversion part containing a first electrode layer, a second electrode layer opposing to the first electrode layer and a photoelectric conversion layer disposed between the first electrode layer and the second electrode layer, in the case where light is made incident from an upper part of the second electrode layer, by transferring a hole as generated within the photoelectric conversion layer into the first electrode layer, storing the hole as transferred into the first electrode layer in a charge storage part as formed within a semiconductor substrate and reading out a signal corresponding to the hole as stored in the charge storage part into the outside by a signal read-part part as formed within the semiconductor substrate such as CCD and CMOS circuits, the photoelectric conversion efficiency is improved and a lowering of the sensitivity and broadening of the spectral sensitivity are prevented from occurring.

As the grounding for this, there may be enumerated the matter that when a transfer distance of an electron is long, a part of the electron is collected by the electrode layer due to the generation of deactivation during the transfer or the like, whereby the photoelectric conversion efficiency is lowered, whereas even when a transfer distance of a hole is long, the mobility of the hole is very large as compared with that of the electron, whereby its deactivation does not substantially occur during the transfer. Also, there may be enumerated the matter that as described previously, not only the mobility of the electron is very small as compared with that of the hole, but also it becomes smaller due to the influences of the air, whereas even when the hole is influenced by the air, its moldability is originally large so that the influences of the air are limitative.

The embodiments of the invention will be hereunder described with reference to the accompanying drawings. In the following embodiments, configuration examples which are enumerated as sensors having a configuration in which the foregoing photoelectric conversion part is stacked in an upper part of a semiconductor substrate will be described.

First Embodiment

Figure 1:
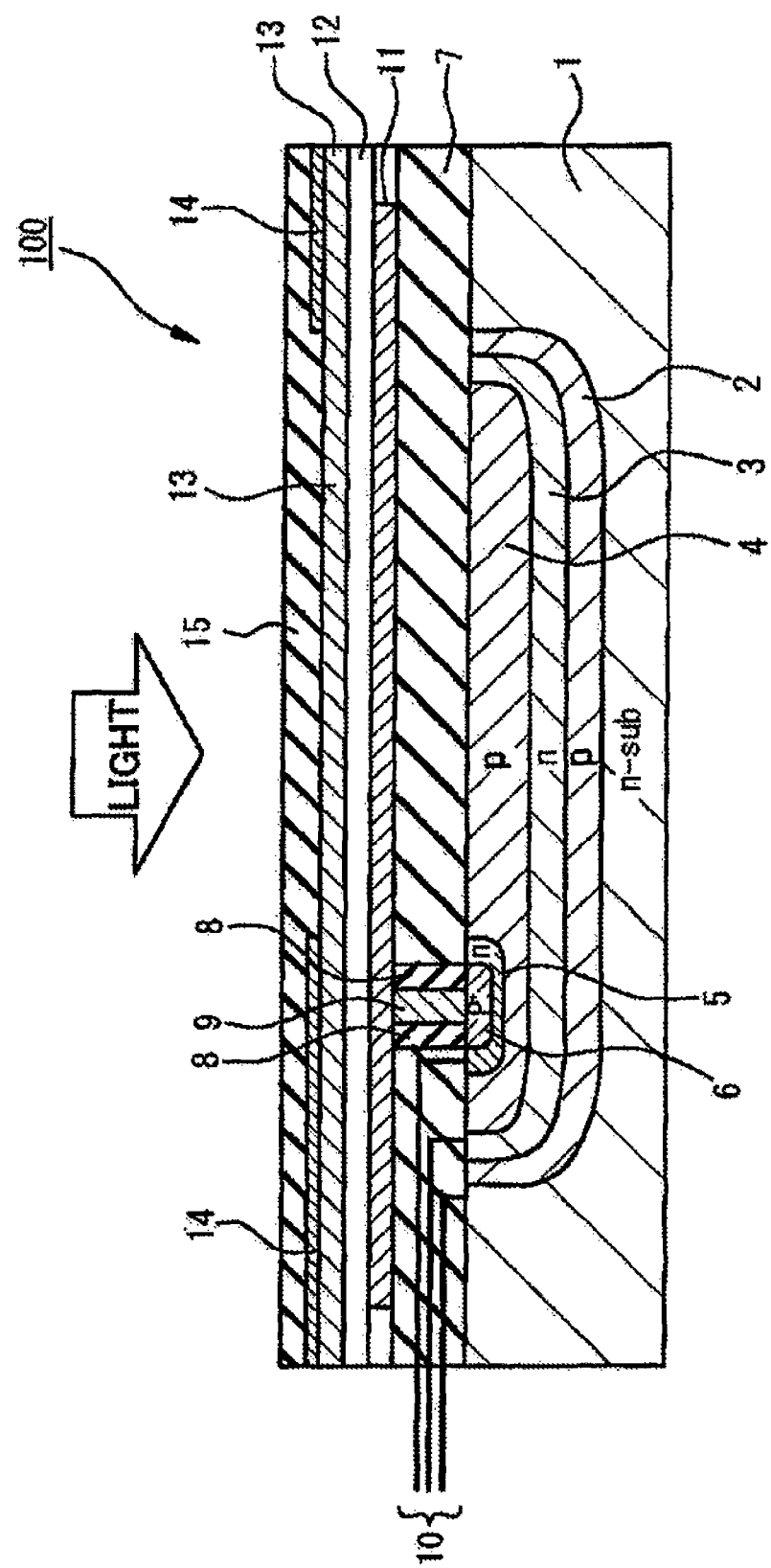
FIG. 1 is a cross-sectional schematic view of a portion of one pixel of a solid-state imaging device for explaining a first embodiment of the invention.
Figure 2:
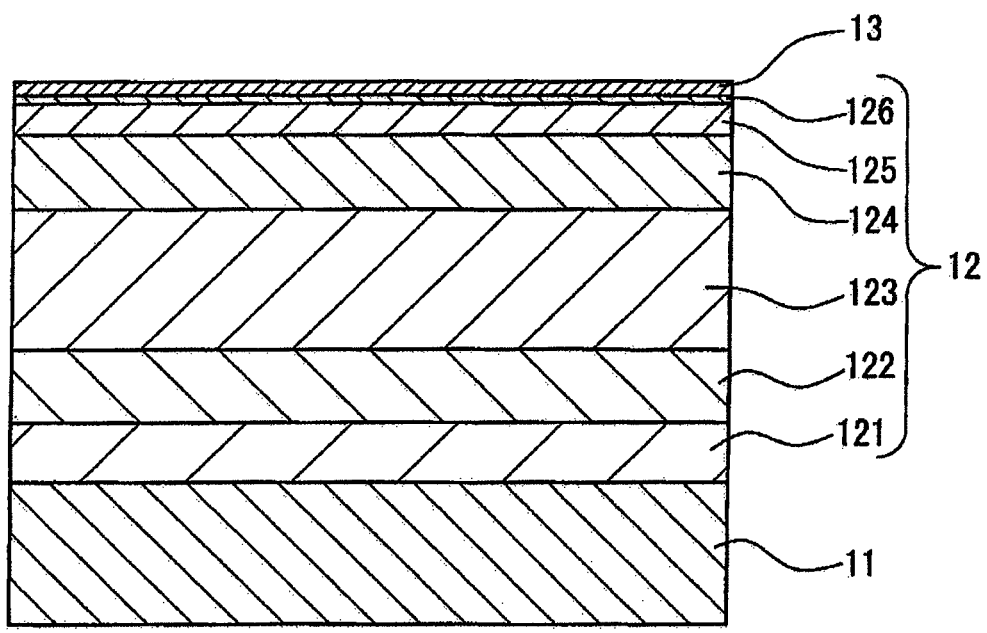
FIG. 2 is a cross-sectional schematic view of a photoelectric conversion layer as illustrated in FIG. 1.

FIG. 1 is a cross-sectional schematic view of a portion of one pixel of a solid-state imaging device for explaining a first embodiment of the invention. FIG. 2 is a cross-sectional schematic view of a photoelectric conversion layer as illustrated in FIG. 1. In this solid-state imaging device, a plural number of the one pixel as illustrated in FIG. 1 is disposed in an array state on the same plane, and one pixel data of image data can be produced by a signal as obtained from this one pixel.

One pixel of a solid-state imaging device 100 as illustrated in FIG. 1 is configured to contain a photoelectric conversion part which is made of an n-type silicon substrate 1, a transparent insulating layer 7 as formed on the n-type silicon substrate 1, a first electrode layer 11 as formed on the insulating layer 7, a photoelectric conversion layer 12 as formed on the first electrode layer 11, and a second electrode layer 13 as formed on the photoelectric conversion layer 12; a light-shielding layer 14 provided with an opening is formed on the photoelectric conversion part; and a light receiving region of the photoelectric conversion layer 12 is limited by this light-shielding layer 14. Furthermore, a transparent insulating layer 15 is formed on the light-shielding layer 14 and the second electrode layer 13.

As illustrated in FIG. 2, the photoelectric conversion layer 12 is configured such that a leveling layer 121, an electron blocking layer 122, a photoelectric conversion layer 123, a hole blocking layer 124, a hole blocking and buffering layer 125, and a work function adjusting layer 126 are stacked in this order on the first electrode layer 11. It is only required that the photoelectric conversion layer 12 contains at least the photoelectric conversion layer 123 of these layers.

The photoelectric conversion layer 123 is configured to contain a material having such characteristics that it generates a charge containing an electron and a hole corresponding to the incident light from an upper part of the second electrode layer 13; that a mobility of the electron is smaller than that of the hole; and that the electron and the hole are generated in larger amounts in the vicinity of the second electrode layer 13 than those in the vicinity of the first electrode layer 11. Representative examples of such a material for the photoelectric conversion layer include organic materials. In the configuration of FIG. 1, a material capable of absorbing green light and generating an electron and a hole corresponding to this is used for the photoelectric conversion layer 123. Since the photoelectric conversion layer 123 can be commonly used in all pixels, so far as it is a layer having a single sheet configuration, it is not required that the photoelectric conversion layer 123 is separated for every pixel.

It is preferable that the organic material which configures the photoelectric conversion layer 123 contains at least one of an organic p-type semiconductor and an organic n-type semiconductor. As the organic p-type semiconductor and the organic n-type semiconductor, all of quinacridone derivatives, naphthalene derivatives, anthracene derivatives, phenanthrene derivatives, tetracene derivatives, pyrene derivatives, perylene derivatives, and fluoranthene derivatives can be especially preferably used.

The organic p-type semiconductor (compound) is an organic semiconductor (compound) having donor properties and refers to an organic compound which is mainly represented by a hole transporting organic compound and which has properties such that it is liable to provide an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transporting organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene derivatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds and metal complexes having, as a ligand, nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanide dyes, styryl dyes, hemicyanine dyes, merocyanine dyes (inclusive of zeromethinemerocyanine (simple merocyanine)), trinuclear merocyanine dyes, tetranuclear merocyanine rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes; azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex and fused aromatic carbocyclic compounds (for example, naphthalene derivatives, anthracene, derivatives, phenanthrene derivatives, tetracene derivatives, pyrene derivatives, perylene derivatives, and fluoranthene derivatives).

Next, the metal complex compound will be described. The metal complex compound is a metal complex having a ligand containing at least one of a nitrogen atom, an oxygen atom and a sulfur atom as coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 0.1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethyl-phenyloxy, and 4-biphenyloxy), an aromatic heterocyclic oxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, an aromatic heterocyclic oxy ligand, or a siloxy ligand; and further preferably a nitrogen-containing heterocyclic ligand, an aryloxy ligand, or a siloxy ligand.

The case where the photoelectric conversion layer 12 contains a photoelectric conversion layer having a p-type semiconductor layer and an n-type semiconductor layer, with at least one of the p-type semiconductor layer and the n-type semiconductor layer being an organic semiconductor, and a bulk heterojunction structure layer containing the p-type semiconductor and the n-type semiconductor as an interlayer between these semiconductor layers is preferable. In such case, by containing a bulk heterojunction structure in the photoelectric conversion layer 12, a drawback that the photoelectric conversion layer 12 has a short carrier diffusion length is compensated, thereby improving the photoelectric conversion efficiency. Incidentally, the bulk heterojunction structure is described in detail in Japanese Patent Application No. 2004-080639.

Furthermore, the case where the photoelectric conversion layer 12 contains a photoelectric conversion layer having a structure having the number of a repeating structure (tandem structure) of a pn junction layer formed of the p-type semiconductor layer and the n-type semiconductor layer is preferable; and the case where a thin layer made of a conducting material is inserted between the foregoing repeating structures is more preferable. The number of the repeating structure (tandem structure) of a pn junction layer is not limited. For the purpose of enhancing the photoelectric conversion efficiency, the number of the repeating structure (tandem structure) of a pn junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930.

Furthermore, the case where the photoelectric conversion layer which is contained in the photoelectric conversion layer 12 has a layer of a p-type semiconductor and a layer of an n-type semiconductor (preferably a mixed or dispersed (bulk heterojunction structure) layer) and contains an orientation-controlled organic compound in at least one of the p-type semiconductor and the n-type semiconductor is preferable; and the case where the photoelectric conversion layer which is contained in the photoelectric conversion layer 12 which contains an orientation-controlled (orientation controllable) organic compound in both the p-type semiconductor and the n-type semiconductor is more preferable. As the organic compound which is used in the organic layer of the photoelectric conversion device, an organic compound having a π-conjugated electron is preferably used. The π-electron plane is not vertical to a substrate (electrode substrate) and is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is only required that even a part of the layer of the orientation-controlled organic compound is contained over the whole of the photoelectric conversion layer 12. A proportion of the orientation-controlled portion to the whole of the photoelectric conversion layer 12 is preferably 10% or more, more preferably 30% or more, further preferably 50% or more, still further preferably 70% or more, especially preferably 90% or more, and most preferably 100%. By controlling the orientation of the organic compound which is contained in the photoelectric conversion layer 12, the foregoing state compensates a drawback that the photoelectric conversion layer 12 has a short carrier diffusion length, thereby improving the photoelectric conversion efficiency.

In the case where the orientation of an organic compound is controlled, it is more preferable that the heterojunction plane (for example, a pn junction plane) is not in parallel to a substrate. In this case, it is preferable that the heterojunction plane is not in parallel to the substrate (electrode substrate) but is oriented at an angle close to verticality to the substrate as far as position. The angle to the substrate is preferable 0° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate). As described previously, it is only required that even a part of the layer of the heterojunction plane-controlled organic compound is contained over the whole of the photoelectric conversion layer 12. A proportion of the orientation-controlled portion to the whole of the photoelectric conversion layer 12 is preferably 10% or more, more preferably 30% or more, further preferably 50% or more, still further preferably 70% or more, especially preferably 90% or more, and most preferably 100%. In such case, the area of the heterojunction plane in the photoelectric conversion layer 12 increases and the amount of a carrier such as an electron as formed on the interface, a hole, and a pair of an electron and a hole increases so that it is possible to improve the photoelectric conversion efficiency. In the light of the above, in the photoelectric conversion layer in which the orientation of the organic compound on both the heterojunction plane and the π-electron plane is controlled, it is possible to improve especially the photoelectric conversion efficiency. These states are described in detail in Japanese Patent Application No. 2004-079931. From the standpoint of optical absorption, it is preferable that the layer thickness of the organic dye layer is as thick as possible. However, taking into consideration a proportion which does not contribute to the charge separation, the layer thickness of the organic dye layer in the invention is preferably 30 nm or more and not more than 300 nm, more preferably 50 nm or more and not more than 250 nm, and especially preferably 80 nm or more and not more than 200 nm.

The photoelectric conversion layer 12 containing such an organic compound is deposited by a dry deposition method or a wet deposition method. Specific examples of the dry deposition method include physical vapor phase epitaxy methods such as a vacuum vapor deposition method, a sputtering method, an ion plating method, and an MBE method and CVD methods such as plasma polymerization. Examples of the wet deposition method include a casting method, a spin coating method, a dipping method, and an LB method.

In the case of using a high molecular compound in at least one of the p-type semiconductor (compound) and the n-type semiconductor (compound), it is preferable that the deposition is achieved by a wet deposition method which is easy for the preparation. In the case of employing a dry deposition method such as vapor deposition, the use of a high molecular compound is difficult because of possible occurrence of decomposition. Accordingly, its oligomer can be preferably used instead of that. On the other hand, in the case of using a low molecular compound, a dry deposition method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to achieve uniform vapor deposition, it is preferable that the vapor deposition is carried out while rotating the substrate. A high degree of vacuum is preferable. The vacuum vapor deposition is carried out at a degree of vacuum of not more than $10^{-4}$ Torr, preferably not more than $10^{-6}$ Torr, and especially preferably not more than $10^{-8}$ Torr. It is preferable that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator and an interferometer. In the case of vapor depositing two or more kinds of compounds at the same time, a co-vapor deposition method, a flash vapor deposition method and so on can be preferably employed.

Since the solid-state imaging device 100 has the photoelectric conversion layer 123 having the foregoing characteristics, by collecting a hole by the first electrode 11 which is an electrode opposing to the electrode in the light incident side and utilizing this, the external quantum efficiency can be enhanced so that it becomes possible to improve the sensitivity and to sharpen the spectral sensitivity. Then, in the solid-state imaging device 100, a voltage is applied to the first electrode layer 11 and the second electrode layer 13 such that an electron as generated in the photoelectric conversion layer 123 transfers into the second electrode layer 13 and that a hole as generated in the photoelectric conversion layer 123 transfers into the first electrode layer 11.

The leveling layer 121 works to relieve irregularities on the first electrode layer 11. In the case where irregularities are present on the first electrode layer 11 or in the case where contaminants attach onto the first electrode layer 11, if a low molecular weight organic material is subjected to vapor deposition thereon to form the photoelectric conversion layer 123, a fine crack is likely formed in this irregular portion of the photoelectric conversion layer 123, namely a portion where the photoelectric conversion layer 123 is formed in only a thin thickness is likely formed. At this time, if the second electrode layer 13 is further formed thereon, since the crack part is covered by the second electrode layer 13 and becomes close to the first electrode layer 11, a DC short circuit or an increase of the leak current is likely generated. In particular, in the case where TCO is used as the second electrode layer 13, such a tendency is remarkable. For that reason, by providing the leveling layer 121 on the first electrode layer 11 in advance, it is possible to relieve the irregularities and to suppress these phenomena.

As the leveling layer 121, organic high molecular weight materials such as polyaniline, polythiophene, polypyrrole, polycarbazole, PTPDES, and PTPDEK can be enumerated. It is preferable that the leveling layer 121 is formed by a spin coating method.

The electron blocking layer 122 is provided for the purpose of reducing a dark current as caused due to the injection of an electron from the first electrode layer 11 and blocks the injection of an electron from the first electrode layer 11 into the photoelectric conversion layer 123.

The hole blocking layer 124 is provided for the purpose of reducing a dark current as caused due to the injection of a hole from the second electrode layer 13 and blocks the injection of a hole from the second electrode layer 13 into the photoelectric conversion layer 123.

The hole blocking and buffering layer 125 accomplishes not only a function which the hole blocking layer 124 possesses but also a function to reduce damages which are given to the photoelectric conversion layer 123 at the time of fabrication of the second electrode layer 13.

In the case where the second electrode layer 13 is fabricated in the upper layer of the photoelectric conversion layer 123, there is some possibility that the photoelectric conversion layer 123 causes denaturation and generates deterioration in performance such as an increase of the leak current and a lowering of the sensitivity due to a collision of a high energy particle present in an apparatus to be used for the fabrication of the second electrode layer 13, for example, a sputtering particle in a sputtering method, a secondary electron, an Ar particle, and an oxygen negative ion. As one of methods for preventing this matter, it is preferred to provide the buffering layer 125 in the upper layer of the photoelectric conversion layer 123.

As a material of the hole blocking and buffering layer 125, organic materials such as copper phthalocyanine, PTCDA, acetylacetonato complexes, and BCP, organometal compounds, and inorganic materials such as MgAg, and MgO are preferably used. Furthermore, since the hole blocking and buffering layer 125 does not disturb the light absorption of the photoelectric conversion layer 123, it is preferable that the hole blocking and buffering layer 125 has a high light transmittance against visible light; and it is preferred to select a material which does not have absorption in a visible region or to use the hole blocking and buffering layer 125 in an ultra-thin thickness. A proper thickness of the hole blocking and buffering layer 125 varies depending upon the configuration of the photoelectric conversion layer 123, the thickness of the second electrode layer 13, or the like, but in particular, it is preferable that the hole blocking and buffering layer 125 is used in a thickness of from 2 to 50 nm.

The work function adjusting layer 126 works to adjust a work function of the second electrode layer 13, thereby suppressing a dark current. In the case where the second electrode layer 13 is configured of a substance having a relatively large work function (for example, 4.5 eV or more) (for example, any one of ITO, IZO, $ZnO_2$, $SnO_2$, $TiO_2$, and FTO), by using a substance containing a metal having a work function of not more than 4.5 eV (for example, In) as a material of the work function adjusting layer 126, it is possible to effectively suppress a dark current. Advantages which are brought by providing such a work function adjusting layer 126 and so on will be described later.

Turning back to FIG. 1, a p-type semiconductor region (hereinafter referred to as "p region") 4, an n-type semiconductor region (hereinafter referred to as "n region") 3, and a p region 2 are formed in this order from the shallow side within the n-type silicon substrate 1. In a surface part of the portion which is light shielded by the light-shielding layer 14 of the p region 4, a high-density p region (hereinafter referred to as "p+ region") 6 is formed, and the periphery of the p+ region 6 is surrounded by the n region 5.

The depth of a pn junction face between the p region 4 and the n region 3 from the surface of the n-type silicon substrate 1 is a depth for absorbing blue light (about 0.2 μm). Accordingly, the p region 4 and the n region 3 absorb blue light and generate a hole corresponding thereto, thereby forming a photodiode (B photodiode) for storing the hole. The hole as generated in the B photodiode is stored in the p region 4.

The depth of a pn junction face between the p region 2 and the n-type silicon substrate 1 from the surface of the n-type silicon substrate 1 is a depth for absorbing red light (about 2 μm). Accordingly, the p region 2 and the n-type silicon substrate 1 absorb red light and generate a hole corresponding thereto, thereby forming a photodiode (R photodiode) for storing the hole. The hole as generated in the R photodiode is stored in the p region 2.

The p+ region 6 is electrically connected to the first electrode layer 11 via a connecting part 9 as formed in an opening which is opened in the insulating layer 7 and stores the hole as collected by the first electrode layer 11 via the connecting part 9. The connecting part 9 is electrically insulated from other parts that the first electrode layer 11 and the p+ region 6 by an insulating layer 8.

The hole as stored in the p region 2 is converted into a signal corresponding to the amount of a charge thereof by an MOS circuit (not illustrated) which is made of a p-channel MOS transistor as formed within the n-type silicon substrate 1; the hole as stored in the p region 4 is converted into a signal corresponding to the amount of a charge thereof by an MOS circuit (not illustrated) which is made of a p-channel MOS transistor as formed within the n region 3; and the electron as stored in the p+ region 6 is converted into a signal corresponding to the amount of a charge thereof by an MOS circuit (not illustrated) which is made of a p-channel MOS transistor as formed within the n region 5, which is then outputted into the outside of the solid-state imaging device 100. These MOS circuits configure a signal read-out part as set forth in the appended claims. Each of the MOS circuits is connected to a non-illustrated signal read-out pad by a wiring 10. Incidentally, an extractor electrode is provided in each of the p region 2 and the p region 4, and when a prescribed reset potential is applied, each of the regions is depleted, and the volume of each of the pn junction parts becomes an infinitely small value. In this way, it is possible to make the volume as generated on the junction face extremely small.

According to such a configuration, G light, can be photoelectrically converted by the photoelectric conversion layer 123, and B light and R light can be photoelectrically converted by the B photodiode and the R photodiode in the n-type silicon substrate 1, respectively. Furthermore, since the G light is first absorbed in the upper part, the color separation between the B and G lights and between the G and R lights is excellent. This is a greatly excellent point as compared with a solid-state imaging device of a type in which three PDs are stacked within a silicon substrate and all of the BGR lights are separated within the silicon substrate. In the following description, portions for carrying out the photoelectric conversion, each, of which is made of an inorganic material as formed within the n-type silicon substrate 1 of the solid-state imaging device 100 (B photodiode and R photodiode), are each referred to as "inorganic layer", too.

Incidentally, it is also possible to form an inorganic photoelectric conversion part capable of absorbing light which has transmitted through the photoelectric conversion layer 123, generating a charge corresponding to the light and storing the charge, which is made of an inorganic material, is provided between the n-type silicon substrate 1 and the first electrode layer 11 (for example, between the insulating layer 7 and the n-type silicon substrate 1). In this case, it is only required that an MOS circuit for reading out a signal corresponding to the charge as stored in a charge storage region of this inorganic photoelectric conversion part is provided within the n-type silicon substrate 1 and that the wiring 10 is connected to this MOS circuit, too.

The first electrode layer 11 plays a role for collecting the hole which has been generated in the photoelectric conversion layer 123 and transferred. The first electrode layer 11 is separated in every pixel so that an image data can be produced. In the configuration as illustrated in FIG. 1, since the photoelectric conversion is also carried out in the n-type silicon substrate 1, the first electrode layer 11 preferably has a light transmittance against visible light of 60% or more, and more preferably 90% or more. In the case where no photoelectric conversion region is present in the lower part of the first electrode layer 11, the first electrode layer 11 may be made of a material with low transparency. As the material, all of ITO, IZO, $ZnO_2$, $SnO_2$, $TiO_2$, FTO, Al, Ag, and Au can be mostly preferably used. Details of the first electrode layer 11 will be described later.

The second electrode layer 13 has a function to discharge the electron which has been generated in the photoelectric conversion layer 123 and transferred. The second electrode layer 13 can be commonly used in all pixels. For that reason, in the solid-state imaging device 100, the second electrode layer 13 is a layer having a single sheet configuration commonly in all pixels. In the second electrode layer 13, since it is necessary to make light incident into the photoelectric conversion layer 123, a material having high transmittance against visible light must be used. The second electrode layer 13 preferably has a light transmittance against that visible light of 60% or more, and more preferably 90% or more. As a material which can be used for the second electrode layer 13, all of ITO, IZO, $ZnO_2$, $SnO_2$, $TiO_2$, FTO, Al, Ag, and Au can be mostly preferably used. Details of the second electrode layer 13 will be described later.

With respect to the inorganic layer, pn junction or pin junction of crystalline silicon, amorphous silicon, or a compound semiconductor such as GaAs is generally employed. In this case, since the color separation is carried out with a light penetration depth of silicon, a spectrum range as received in each of the stacked light receiving parts becomes broad. However, by using the photoelectric conversion layer 12 as the upper layer as illustrated in FIG. 1, namely by detecting the light which has transmitted through the photoelectric conversion layer 12 in the depth direction of silicon, the color separation is remarkably improved. In particular, when G light is detected by the photoelectric conversion layer 12 as illustrated in FIG. 1, since light which has transmitted through the photoelectric conversion layer 12 is B light and R light, only BR lights are subjective to separation of light in the depth direction in silicon so that the color separation is improved. Even in the case where the photoelectric conversion layer 12 detects the B light or the R light, by properly selecting the depth of the pn junction face of silicon, the color separation is remarkably improved.

With respect to the configuration of the inorganic layer, npn junction or pnpn junction from the light incident side is preferable. In particular, the pnpn junction is more preferable because by providing a p layer on the surface and increasing a potential of the surface, it is possible to trap a hole as generated in the vicinity of the surface and a dark current, thereby reducing the dark current.

Incidentally, while the configuration in which one photoelectric conversion part is stacked in the upper part of the n-type silicon substrate 1 is illustrated in FIG. 1, it is also possible to employ a configuration in which plural photoelectric conversion parts are stacked in the upper part of the n-type silicon substrate 1. The configuration in which plural photoelectric conversion parts are stacked will be described in a third embodiment as described later. In such case, the light which is detected in the inorganic layer may be a single color, and preferred color separation can be achieved. Furthermore, in the case where it is intended to detect lights of four colors in one pixel of the solid-state imaging device 100, for example, there are thought a configuration in which one color is detected in one photoelectric conversion part and three colors are detected in the inorganic layer; a configuration in which two photoelectric conversion parts are stacked, thereby detecting therein two colors and other two colors are detected in the inorganic layer; and a configuration in which three photoelectric conversion parts are stacked, thereby detecting three colors therein and one color is detected in the inorganic layer. Furthermore, the solid-state imaging device 100 may be configured to detect only one color in one pixel. This case is corresponding to the configuration as illustrated in FIG. 1, except that the p region 2, the n region 3 and the p region 4 are eliminated.

The inorganic layer will be hereunder described in more detail. Preferred examples of the construction of the inorganic layer include a photoconductive type, a p-n junction type, a shotkey junction type, a PIN junction type, a light receiving device of MSM (metal-semiconductor-metal) type, and a light receiving device of phototransistor type. In the invention, it is preferred to use a light receiving device in which a plural number of a first conducting type region and a second conducting type region which is a reversed conducting type to the first conducting type are alternately stacked within a single semiconductor substrate and each of the junction planes of the first conducting type and second conducting type regions is formed in a depth suitable for subjecting mainly plural lights of a different wavelength region to photoelectric conversion. The single semiconductor substrate is preferably mono-crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor as adjusted so as to have a maximum absorption value within a blue wavelength range by properly changing the In-containing composition. That is, the composition becomes $In_xGa_{1-x}N$ ($0 \leq x < 1$). Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving part similar to the InGaN based semiconductor. Furthermore, InAlP or InGaAlP lattice-matching with a GaAs substrate can also be used.

The inorganic semiconductor may be of a buried structure. The "buried structure" as referred to herein refers to a construction in which the both ends of a short wavelength light receiving part are covered by a semiconductor different from the short wavelength light receiving part. The semiconductor for covering the both ends is preferably a semiconductor having a band gap wavelength shorter than or equal to a band gap wavelength of the short wavelength light receiving part.

Examples of a material for the first electrode layer 11 and the second electrode layer 13 which can be used metals, alloys, metal oxides, electrically conducting compounds, and mixtures thereof. Examples of the metallic material include arbitrary combinations selected from Li, Na, Mg, K, Ca, Rb, Sr, Cs, Ba, Fr, Ra, Sc, Ti, Y, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, C, N, F, O, S, and N. Of these, Al, Pt, W, Au, Ag, Ta, Cu, Cr, Mo, Ti, Ni, Pd, and Zn are especially preferable.

Since the first electrode layer 11 extracts a hole from a hole transporting photoelectric conversion layer or a hole transport layer which is contained in the photoelectric conversion layer 12 and collects it, the first electrode layer 11 is selected while taking into consideration adhesion to an adjacent layer such as the hole transporting photoelectric conversion layer and the hole transport layer, electron affinity, ionization potential, stability, and the like. Since the second electrode layer 13 extracts an electron from an electron transporting photoelectric conversion layer or an electron transport layer which is contained in the photo electric conversion layer 12 and discharges it, the second electrode layer 13 is selected while taking into consideration adhesion to an adjacent layer such as the electron trans-porting photoelectric conversion layer and the electron transport layer, electron affinity, ionization potential, stability, and the like. Specific examples thereof include conducting metal oxides such as tin oxide, zinc oxide, indium oxide, and indium tin oxide (ITO); metals such as gold, silver, chromium, and nickel; mixtures or stacks of such a metal and such a conducting metal oxide; inorganic conducting substances such as copper iodide and copper sulfide; organic conducting materials such as polyaniline, polythiophene, and polypyrrole; silicon compounds; and stack materials thereof with ITO. Of these, conducting metal oxides are preferable; and ITO and IZO (indium zinc oxide) are especially preferable in view of productivity, high conductivity, transparency, and so on.

In the preparation of the electrode, various methods are employable depending upon the material. For example, in the case of ITO, the layer is formed by a method such as an electron beam method, a sputtering method, a resistance heating vapor deposition method, a chemical reaction method (for example, a sol-gel method), and coating of a dispersion of indium tin oxide. In the case of ITO, a UV-ozone treatment, a plasma treatment, or the like can be applied.

Conditions at the time of fabrication of a transparent electrode layer will be hereunder mentioned. A substrate temperature at the time of fabrication of a transparent electrode layer is preferably not higher than 500° C., more preferably not higher than 300° C., further preferably not higher than 200° C., and still further preferably not higher than 150° C. Furthermore, a gas may be introduced during the fabrication of a transparent electrode. Basically, though the gas species is not limited, Ar, He, oxygen, nitrogen, and so on can be used. Furthermore, a mixed gas of such gases may be used. In particular, in the case of an oxide material, since oxygen deficiency often occurs, it is preferred to use oxygen.

Furthermore, with respect to a surface resistance of the transparent electrode layer, its preferred range varies depending upon whether the transparent electrode layer is the first electrode layer 11 or the second electrode layer 13 or the like. In the case where the read-out part is of a CMOS structure, the surface resistance is preferably not more than 10,000Ω/□, and more preferably not more than 1,000Ω/□. In the case where the read-out part is of a CCD structure, the surface resistance is preferably not more than 1,000Ω/□, and more preferably not more than 100Ω/□. In the case where the transparent electrode layer is used in the second electrode layer 13, the surface resistance is preferably not more than 1,000,000Ω/□, and more preferably not more than 100,000Ω/□.

As the material of the transparent electrode layer, any one material of ITO, IZO, $SnO_2$, ATO (antimony-doped tin made), ZnO, AZO (Al-doped zinc oxide), GZO (gallium-doped zinc oxide), $TiO_2$, or FTO (fluorine-doped tin oxide) is especially preferable. A light transmittance of the transparent electrode layer is preferably 60% or more, more preferably 80% or more, further preferably 90% or more, and still further preferably 95% or more at an absorption peak wavelength of the photoelectric conversion layer to be contained in the photoelectric conversion part containing that transparent electrode layer.

Furthermore, in the case where a plural number of the photoelectric conversion layer 12 is stacked, in the first electrode layer 11 and the second electrode layer 13, from the photoelectric conversion layer located in the closet position to the light incident side to the photoelectric conversion layer located in the farthest position from the light incident side must each transmit lights other than the light which is detected by each of the photoelectric conversion layer. It is preferred to use a material capable of transmitting 90% or more, and more preferably 95% or more of light against visible light.

It is preferable that the second electrode layer 13 is prepared in a plasma-free state. By preparing the second electrode layer 13 in a plasma-free state, it is possible to minimize influences of the plasma against the substrate and to make photoelectric conversion characteristics satisfactory. Here, the term "plasma-free state" means a state that plasma is not generated during the fabrication of the second electrode layer 13 or that a distance from the plasma generation source to the substrate is 2 cm or more, preferably 10 cm or more, and more preferably 20 cm or more and that the plasma which reaches the substrate is reduced.

Examples of a device in which plasma is not generated during the fabrication of the second electrode layer 13 include an electron beam vapor deposition device (EB vapor deposition device) and a pulse laser vapor deposition device. With respect to the EB vapor deposition device or pulse laser vapor deposition device, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used. In the following, the method for achieving fabrication of a transparent electrode film using an EB vapor deposition device is referred to as "EB vapor deposition method"; and the method for achieving fabrication of a transparent electrode film using a pulse laser vapor deposition device is referred to as "pulse laser vapor deposition method".

With respect to the device capable of realizing the state that a distance from the plasma generation source to the substrate is 2 cm or more and that the plasma which reaches the substrate is reduced (hereinafter referred to as "plasma-free deposition device"), for example, a counter target type sputtering device and an arc plasma vapor deposition method can be thought. With respect to these matters, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used.

In the case where a transparent conducting layer such as TCO is used as the second electrode layer 13, a DC short circuit or an increase of the leak current may possibly be generated. It is thought that one of these causes resides in the matter that a fine crack which is introduced into the photoelectric conversion layer 123 is covered by a minute layer such as TCO, whereby the continuity with the first electrode layer 11 in the opposite side increases. For that reason, in the case of an electrode which is relatively inferior in layer quality, such as Al, the increase of the leakage current hardly occurs. By controlling the thickness of the second electrode layer 13 against the thickness of the photoelectric conversion layer 123 (namely, the crack depth), the increase of the leak current can be largely reduced. It is desired that the thickness of the second electrode layer 13 is not more than ⅕, and preferably not more than 1/10 of the thickness of the photoelectric conversion layer 12.

Usually, when the conducting thin layer is thinner than a certain range, an abrupt increase of the resistance value is brought. In the solid-state imaging device 100 of this embodiment, the sheet resistance may be preferably from 100 to 10,000Ω/□, and the degree of freedom with respect to the range of the thickness it which the layer can be thinned is large. Furthermore, when the thickness of the transparent conducting thin layer is thin, the amount of light to be absorbed becomes small, and the light transmittance generally increases. The increase of the light transmittance is very preferable because the light absorption in the photoelectric conversion layer 123 is increased and the light conversion ability is increased. Taking into account the reduction of the leakage current, the increase of the resistance value of the thin layer and the increase of the light transmittance following thinning of the layer, it is desired that the thickness of the transparent conducting thin layer is from 5 to 100 nm, and preferably from 5 to 20 nm.

As the material of the transparent electrode layer, materials which can be deposited by a plasma-free deposition device, EB vapor deposition device or pulse laser vapor deposition device. For example, metals, alloys, metal oxides, metal nitrides, metallic borides, organic conducting compounds, and mixtures thereof can be suitably enumerated. Specific examples thereof include conducting metal oxides such as tin oxide, zinc oxide, indium oxide, indium zinc oxide (IZO), indium tin oxide (ITO), and indium tungsten oxide (IWO); metal nitrides such as titanium nitride; metals such as gold, platinum, silver, chromium, nickel, and aluminum; mixtures or stacks of such a metal and such a conducting metal oxide; inorganic conducting substances such as copper iodide and copper sulfide; organic conducting materials such as polyaniline, polythiophene, and polypyrrole; and stacks thereof with ITO. Also, materials as described in detail in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing. Co., Ltd., 2002); *Technologies of Transparent Conducting Films*, written by Japan Society for the Promotion of Science (published by Ohmsha, Ltd., 1999); and references as added therein may be used.

Next, advantages which are brought by providing the work function adjusting layer 126 will be described. The details of the work function adjusting layer are described in Japanese Patent Application No. 2005-251745.

In the case wherein the second electrode layer 13 is made of a material having a high work function and high transparency such as ITO, IZO, $ZnO_2$, $SnO_2$, $TiO_2$, and FTO, a dark current is considerably large as approximately 10 $\mu A/cm^2$ when vias voltage of 1 V is applied on it.

It is thought that one of these causes resides in a current which flows in the organic layer from the second electrode layer 13 when bias voltage is applied. In the case where an electrode with high transparency such as ITO, IZO, $ZnO_2$, $SnO_2$, $TiO_2$, and FTO is used as the second electrode layer 13, it was thought that since its work function is relatively large (4.5 eV or more), the barrier of the hole injection into the photoelectric conversion layer 12 becomes low, whereby the hole injection into the photoelectric conversion layer 123 is easy to occur. Actually, in examining the work function of a metal oxide based transparent electrode with high transparency such as ITO, IZO, $ZnO_2$, $SnO_2$, $TiO_2$, and FTO, for example, it is known that an ITO electrode has a work function of approximately 4.8 eV, a value of which is considerably high as compared with a work function of an Al (aluminum) electrode which is approximately 4.3 eV; and that transparent electrodes of a metal oxide other than ITO have a relatively large work function as from about 4.6 to 5.4 eV exclusive of AZO (Al-doped zinc oxide) having the smallest work function as approximately 4.5 eV (see, for example, FIG. 12 of *J. Vac. Sci. Technol., A*17(4), July/August 1999, pages 1765 to 1772).

When the work function of the second electrode layer 13 is relatively large (4.8 eV), the barrier of the hole injection into the organic layer is low, and the hole injection from the second electrode layer 13 into the photoelectric conversion layer 123 is easy to occur. As a result, it is thought that the dark current becomes large. In this embodiment, since the hole blocking layer 124 is provided, the dark current is reduced. However, in the case where the work function of the second electrode layer 13 is large, even when the hole blocking layer 124 is present, it becomes difficult to reduce the dark current.

Then, in this embodiment, a layer having a work function of not more than 4.5 eV was provided between the second electrode layer 13 and the photoelectric conversion layer 123.

Furthermore, metals having a work function of not more than 4.5 eV will be enumerated below along with characteristics thereof.

TABLE 1

Characteristics of metal having a small work function (excluding alkali metals)

| | Work function (eV) | Melting point (° C.) | Boiling point (° C.) | Bulk resistivity (Ωcm) | Reaction with air or water |
|---|---|---|---|---|---|
| Ag | 4.2 | ○: 950 | ○: 2210 | ○: $1.5 \times 10^{-6}$ | ○: Inert |
| Al | 4.3 | ○: 660 | ○: 2470 | ○: $2.5 \times 10^{-6}$ | Δ: Oxide layer formed |
| Ba | 2.5 | ○: 730 | ○: 1640 | Δ: $4.6 \times 10^{-5}$ | X: Oxidized and soluble in water |
| Bi | 4.2 | ○: 270 | ○: 1610 | X: $1.1 \times 10^{-4}$ | ○: Inert |
| Ca | 2.9 | ○: 840 | ○: 1480 | ○: $3.2 \times 10^{-6}$ | X: Oxidized and soluble in water |
| Eu | 2.5 | ○: 820 | ○: 1600 | Δ: $9.0 \times 10^{-5}$ | X: Oxidized and soluble in water |
| Ga | 2.6 | X: 28 | ○: 2400 | Δ: $1.4 \times 10^{-5}$ | ○: Inert |
| Hf | 3.9 | ○: 2230 | Δ: 5200 | Δ: $3.5 \times 10^{-5}$ | Δ: Oxide layer formed |
| In | 4.1 | ○: 160 | ○: 2080 | ○: $8.0 \times 10^{-6}$ | ○: Inert |
| La | 3.5 | ○: 920 | ○: 3460 | ○: $5.7 \times 10^{-6}$ | X: Oxidized and soluble in water |
| Lu | 3.3 | ○: 1660 | ○: 3400 | Δ: $7.9 \times 10^{-5}$ | X: Oxidized and soluble in water |
| Mg | 3.7 | ○: 650 | ○: 1090 | ○: $3.9 \times 10^{-6}$ | X: Oxidized |
| Mn | 4.1 | ○: 1240 | ○: 1960 | X: $2.6 \times 10^{-4}$ | X: Oxidized and soluble in water |
| Nb | 4.3 | ○: 2470 | Δ: 4740 | ○: $1.3 \times 10^{-5}$ | Δ: Oxide layer formed |
| Nd | 3.2 | ○: 1020 | ○: 3070 | Δ: $6.4 \times 10^{-5}$ | X: Soluble in water |
| Pb | 4.2 | ○: 330 | ○: 1740 | Δ: $1.9 \times 10^{-5}$ | X: Oxidized |
| Sc | 3.5 | ○: 1540 | ○: 2830 | Δ: $6.1 \times 10^{-5}$ | X: Oxidized and soluble in water |
| Sm | 2.7 | ○: 1080 | ○: 1790 | Δ: $8.8 \times 10^{-5}$ | X: Soluble in water |
| Sn | 4.5 | ○: 230 | ○: 2270 | Δ: $9.4 \times 10^{-5}$ | ○: Inert |
| Ta | 4.3 | ○: 3000 | Δ: 5430 | ○: $1.2 \times 10^{-5}$ | ○: Inert |
| Tb | 3.0 | ○: 1360 | ○: 3120 | | X: Oxidized and soluble in water |
| Th | 3.4 | ○: 1750 | Δ: 4790 | Δ: $1.3 \times 10^{-5}$ | X: ignited |
| Ti | 4.3 | ○: 1660 | ○: 3290 | Δ: $5.8 \times 10^{-5}$ | ○: Inert |
| V | 4.3 | ○: 1890 | ○: 3377 | Δ: $2.5 \times 10^{-5}$ | ○: Inert |
| W | 4.4 | ○: 3410 | Δ: 5660 | ○: $4.9 \times 10^{-6}$ | ○: Inert |
| Y | 3.1 | ○: 1520 | Δ: 3340 | Δ: $5.7 \times 10^{-5}$ | X: Oxidized |
| Zn | 4.3 | ○: 420 | Δ: 910 | ○: $5.5 \times 10^{-6}$ | X: Oxidized |
| Zr | 4.1 | ○: 1850 | Δ: 4380 | Δ: $4.0 \times 10^{-5}$ | Δ: Oxide layer formed |

| | Material | Viewpoint |
|---|---|---|
| Preferable | Ag, Al, Ca, In, Mg | The resistance is small; the melting point is not excessively low; the boiling point is not excessively high; and the metal is relatively cheap. |
| Especially preferable | Ag, In, Mg | The transparency is high. |
| Most preferable | Ag, In | The reactivity is low. |

Hereafter, the difference of the dark current measured with or without the work function adjusting layer is described. The details are described in Japanese Patent Application No. 2005-251749.

As the example without a work function adjusting layer (comparative example), with respect to a structure in which 100 nm-thick quinacridone (Compound 1 as described later: 5,12-dihydroquino[2,3-b]acridine-7,14-dione) and a 100 nm-thick Al upper electrode (work function: 4.3 eV as determined by an atmospheric photoelectron spectrometer AC-2, manufactured by Riken Keiki Co., Ltd.; visible light transmittance: 0%) are successively stacked on a glass substrate (a commercially available product) having, a 250 nm-thick ITO lower electrode (work function: 4.8 eV; visible light transmittance: about 90%) stacked thereon by vacuum vapor deposition, there is exemplified the case where an electron is collected in the side of the ITO lower electrode. A device (device area: 2 mm×2 mm) was actually prepared and measured. As a result, a dark current at the applied voltage of 1 V (an electron was collected using the lower electrode as a positive bias; hereinafter the same) was a large value as 9.3 $\mu A/cm^2$.

In this case, it is thought that since the work function of ITO as an electron discharge electrode is large, the hole injection from the ITO electrode into the quinacridone is easy to occur when bias voltage is applied so that the dark current becomes large.

On the other hand, as the example with a work function adjusting layer, a device was prepared in the same manner as in the previous comparative example, except for stacking In having a small work function as 4.3 eV in a thickness of 2 nm on an ITO electrode by vacuum vapor deposition and mediating between the quinacridone and the ITO electrode (visible light transmittance of 2 nm-thick In: about 98%). As a result, the dark current at the applied voltage of 1 V is largely reduced to 1.8 $nA/cm^2$ a value of which is lowered by approximately four digits.

This means that the hole injection from the electron discharge electrode is largely reduced by making the work function of the ITO electrode which is the electron discharge electrode small.

Similarly, light of 550 nm was made incident from the ITO electrode side in an irradiation intensity of 50 $\mu W/cm^2$ under a condition of applying bias of 1 V. As a result, the external quantum efficiency (measured the charge number against the incident photon number) was 12%. Furthermore, at the applied bias of 2 V, the dark current was about 100 $nA/cm^2$, and the external quantum efficiency was 19%.

Second Embodiment

In this embodiment, the inorganic layer having a configuration as illustrated in FIG. 1 which is described in the first embodiment is prepared in such a manner that two photodiodes are not stacked within the n-type silicon substrate but that two photodiodes are arranged in a direction vertical to an incident direction of the incident light, thereby detecting lights of two colors within the n-type silicon substrate.

Figure 3:
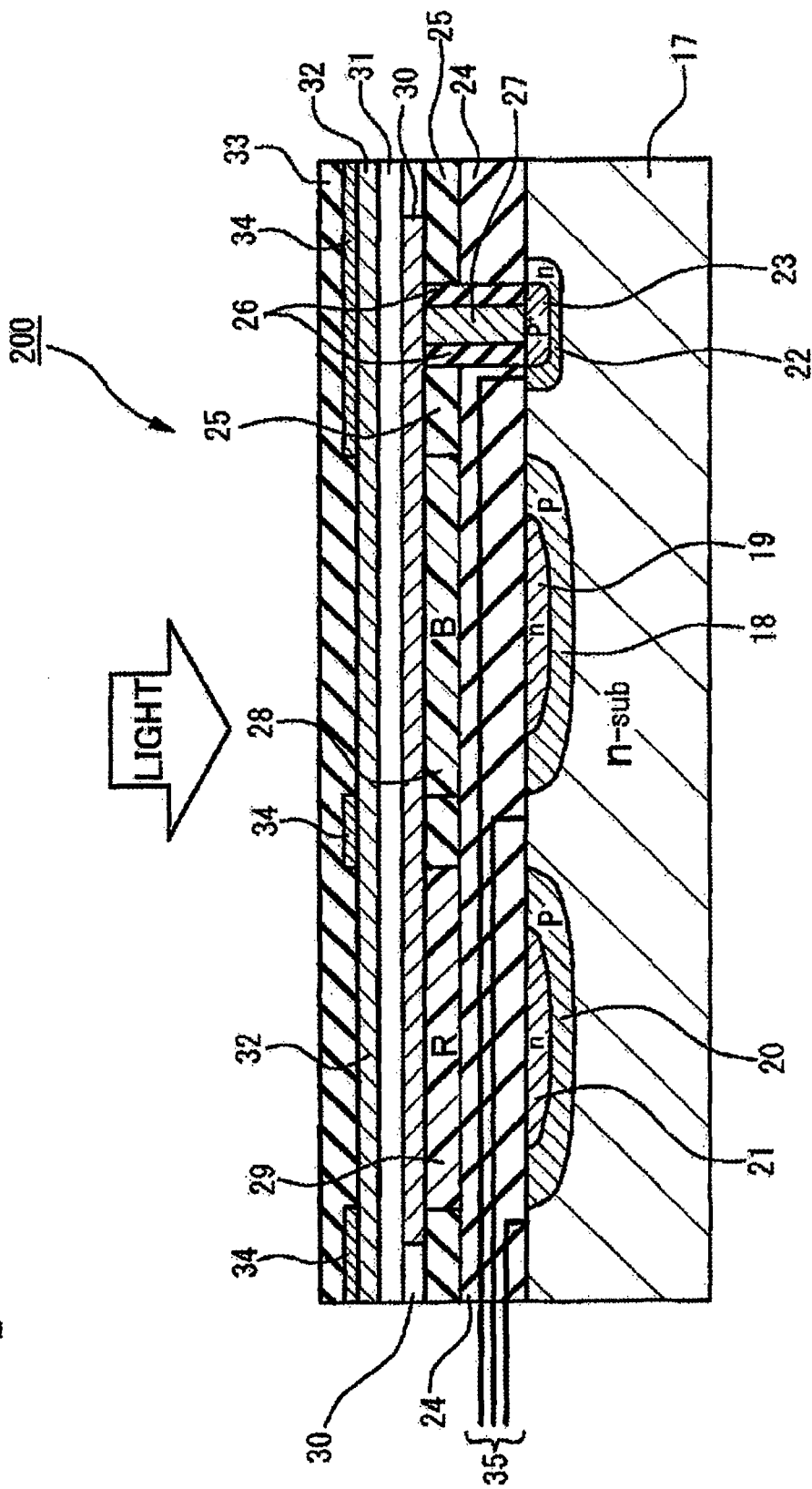
FIG. 3 is a cross-sectional schematic view of a portion of one pixel of a solid-state imaging device for explaining a second embodiment of the invention.

FIG. 3 is a cross-sectional schematic view of a portion of one pixel of a solid-state imaging device for explaining a second embodiment of the invention.

One pixel of a solid-state imaging device 200 as illustrated in FIG. 3 is configured to contain a photoelectric conversion part which is made of an n-type silicon substrate 17, a first electrode layer 30 as formed in an upper part of the n-type silicon substrate 17, a photoelectric conversion layer 31 as formed on the first electrode layer 30, and a second electrode layer 32 as formed on the photoelectric conversion layer 31; a light-shielding layer 34 provided with an opening as formed on the photoelectric conversion part; and a light receiving region of the photoelectric conversion layer 31 is limited by this light-shielding layer 34. Furthermore, a transparent insulating layer 33 is formed on the light-shielding layer 34.

The first electrode layer 30, the photoelectric conversion layer 31 and the second electrode layer 32 are configured in the same way as in the first electrode layer 11, the photoelectric conversion layer 12 and the second electrode layer 13.

A photodiode which is made of an n region 19 and a p region 18 and a photodiode which is made of an n region 21 and a p region 20 are formed side by side on the surface of the n-type silicon substrate 17 in a lower part of the opening of the light-shielding layer 34. An arbitrary direction on the surface of the n-type silicon substrate 17 is a direction vertical to an incident direction of the incident light.

A color filter 28 capable of transmitting B light therethrough via a transparent insulating layer 24 is formed in an upper part of the photodiode which is made of the n region 19 and the p region 18, and the first electrode layer 30 is formed thereon. A color filter 29 capable of transmitting R light therethrough via the transparent insulating 24 is formed in an upper part of the photodiode which is made of the n region 21 and the p region 20, and the first electrode layer 30 is formed thereon. The peripheries of the color filters 28, 29 are covered by a transparent insulating layer 25.

The photodiode which is made of the n region 19 and the p region 18 absorbs the B light which has transmitted through the color filter 28 to generate a hole and stores the generated hole in the p region 18. The photodiode which is made of the n region 21 and the p region 20 absorbs the R light which has transmitted through the color filter 29 to generate a hole and stores the generated hole in the p region 20.

In a portion which is light shielded by the light-shielding layer 34 on the surface of the p-type silicon substrate 17, a p+ region 23 is formed, and the periphery of the p+ region 23 is surrounded by an n region 22.

The p+ region 23 is electrically connected to the first electrode layer 30 via a connecting part 27 as formed in an opening which is opened in the insulating layers 24, 25 and stores a hole as collected by the first electrode layer 30 via the connecting part 27. The connecting part 27 is electrically insulated from other parts than the first electrode layer 30 and the p+ region 23 by an insulating layer 26.

The hole as stored in the p region 18 is converted into a signal corresponding to the amount of a charge thereof by an MOS circuit (not illustrated) which is made of a p-channel MOS transistor as formed within the n-type silicon substrate 17; the hole as stored in the p region 20 is converted into a signal corresponding to the amount of a charge thereof by an MOS circuit (not illustrated) which is made of a p-channel. MOS transistor as formed within the n-type silicon substrate 17; and the hole as stored in the p+ region 23 is converted into a signal corresponding to the amount of a charge thereof by an MOS circuit (not illustrated) which is made of a p-channel MOS transistor as formed within the n region 22, which is then outputted into the outside of the solid-state imaging device 200. These MOS circuits configure a signal read-out part as set forth in the appended claims. Each of the MOS circuits is connected to a non-illustrated signal read-out pad by a wiring 35.

Incidentally, the signal read-out part may be configured of CCD and an amplifier but not an MOS circuit. In other words, the signal read-out part may be configured such that the hole as stored in the p region 18, the p region 20 and the p+ region 23 is read out by CCD as formed within the n-type silicon substrate 17 and transferred into an amplifier by CCD, from which is then outputted a signal corresponding to the hole.

In this way, examples of the signal read-out part include CCD and CMOS structures. Of these, the CMOS structure is preferable in view of consumed electricity, high-speed read-out, pixel addition, partial read-out, and so on.

Incidentally, in FIG. 3, the color separation between the R light and the B light is carried out by the color filters 28, 29. However, the R light and the B light may be absorbed by the respective photodiodes without providing the color filers 28, 29 by adjusting each of a depth of the pn junction face between the p region 20 and the n region 21 and a depth of the pn junction face between the p region 18 and the n region 19. In this case, it is also possible to form an inorganic photoelectric conversion part capable of absorbing light which has transmitted through the photoelectric conversion layer 31, generating a charge corresponding to the light and storing the charge, which is made of an inorganic material, is provided between the n-type silicon substrate 17 and the first electrode layer 30 (for example, between the insulating layer 24 and the n-type silicon substrate 17). In this case, it is only required that an MOS circuit for reading out a signal corresponding to the charge as stored in a charge storage region of this inorganic photoelectric conversion part is provided within the n-type silicon substrate 17 and that the wiring 35 is connected to this MOS circuit, too.

Furthermore, a configuration in which one photodiode is provided within the n-type silicon substrate 17 and plural photoelectric conversion parts are stacked in the upper part of the n-type silicon substrate 17 may be employed. In addition, a configuration in which plural photodiodes are provided within the n-type silicon substrate 17 and plural photoelectric conversion parts are stacked in the upper part of the n-type silicon substrate 17 may be employed. Moreover, in the case where it is not necessary to prepare a color image, a configuration in which one photodiode is provided within the n-type silicon substrate 17 and only one photoelectric conversion part is stacked thereon may be employed.

Third Embodiment

A solid-state imaging device of this embodiment is configured such that the inorganic layer having a configuration as illustrated in FIG. 1 which, is described in the first embodiment is not provided and plural (three in this instance) photoelectric conversion layers are stacked in an upper part of the silicon substrate.

Figure 4:
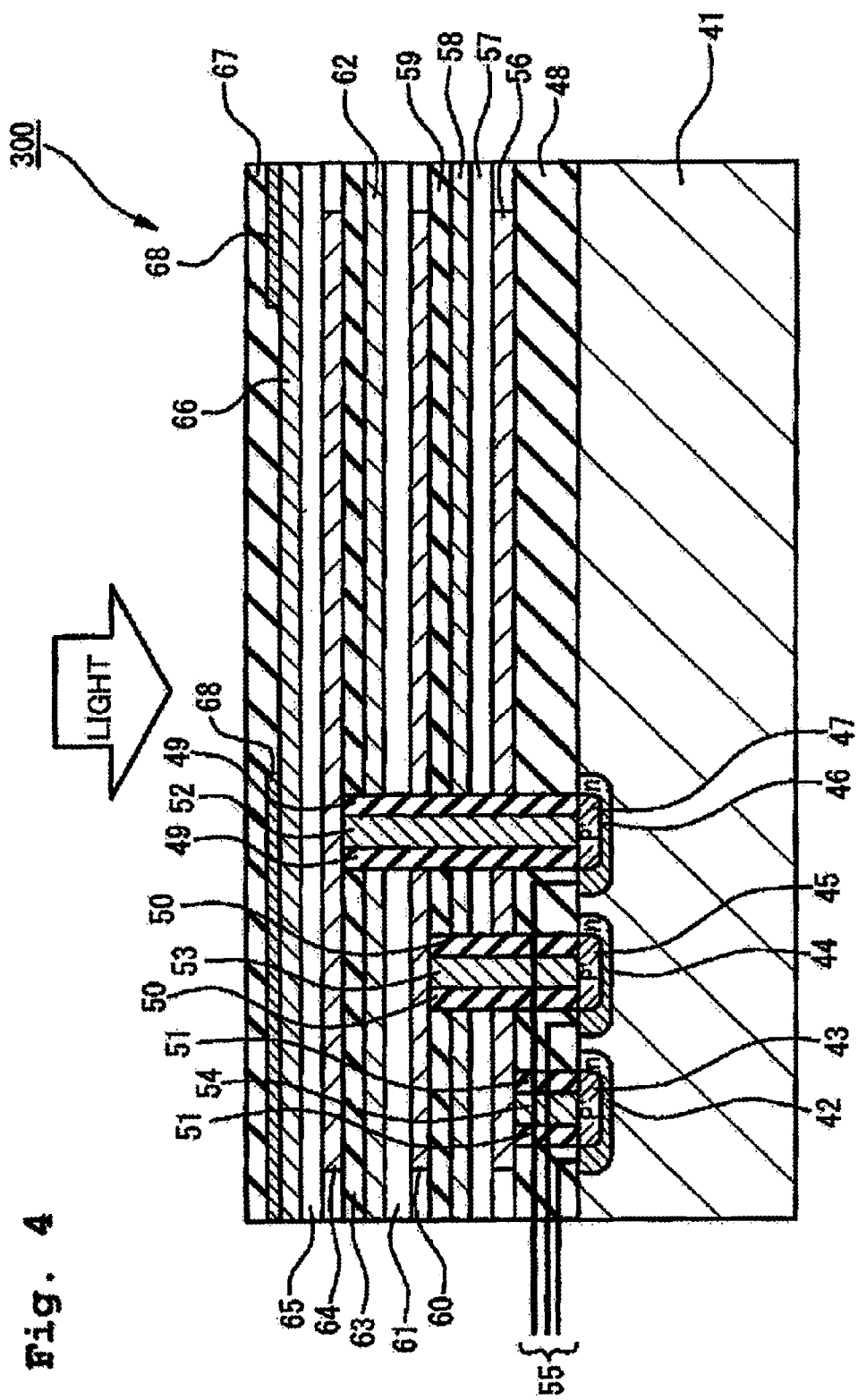
FIG. 4 is a cross-sectional schematic view of a portion of one pixel of a solid-state imaging device for explaining a third embodiment of the invention.

FIG. 4 is a cross-sectional schematic view of a portion of one pixel of a solid-state imaging device for explaining a third embodiment of the invention.

A solid-state imaging device 300 as illustrated in FIG. 4 is configured such that an R photoelectric conversion part containing a first electrode layer 56, a photoelectric conversion layer 57 as stacked on the first electrode layer 56 and a second electrode layer 58 as stacked on the photoelectric conversion layer 57; a B photoelectric conversion part containing a first electrode layer 60, a photoelectric conversion layer 61 as stacked on the first electrode layer 60 and a second electrode layer 62 as stacked on the photoelectric conversion layer 61; and a G photoelectric conversion part containing a first electrode layer 64, a photoelectric conversion layer 65 as stacked on the first electrode layer 64 and a second electrode layer 66 as stacked on the photoelectric conversion layer 65 are stacked in this order in an upper part of a silicon substrate 41 in a state that the first electrode layer to be contained in each of the photoelectric conversion parts is faced in the side of the silicon substrate 41.

A transparent insulating layer 48 is formed on the silicon substrate 41; the R photoelectric conversion part is formed thereon; a transparent insulating layer 59 is formed thereon; the B photoelectric conversion part is formed thereon; a transparent insulating layer 63 is formed thereon; the G photoelectric conversion part is formed thereon; a light-shielding layer 68 provided with an opening is formed thereon; and a transparent insulating layer 67 is formed thereon.

The first electrode layer 64, the photoelectric conversion layer 65 and the second electrode layer 66 which are contained in the G photoelectric conversion part are configured in the same way as in the first electrode layer 11, the photoelectric conversion layer 12 and the second electrode layer 13 as illustrated in FIG. 1.

The first electrode layer 60, the photoelectric conversion layer 61 and the second electrode layer 62 which are contained in the B photoelectric conversion part are configured in the same way as in the first electrode layer 11, the photoelectric conversion layer 12 and the second electrode layer 13 as illustrated in FIG. 1. However, a material capable of absorbing blue light and generating an electron and a hole corresponding thereto is used in a photoelectric conversion layer which is contained in the photoelectric conversion layer 61.

The first electrode layer 56, the photoelectric conversion layer 57 and the second electrode layer 58 which are contained in the R photoelectric conversion part are configured in the same way as in the first electrode layer 11, the photoelectric conversion layer 12 and the second electrode layer 13 as illustrated in FIG. 1. However, a material capable of absorbing red light and generating an electron and a hole corresponding thereto is used in a photoelectric conversion layer which is contained in the photoelectric conversion layer 57.

In a portion which is light shielded by the light-shielding layer 68 on the surface of the silicon substrate 41, p+ regions 43, 45, 47 are formed, and the peripheries of the respective p+ regions are surrounded by n regions 42, 44, 46.

The p+ region 43 is electrically connected to the first electrode layer 56 via a connecting part 54 as formed in an opening which is opened in the insulating layer 48 and stores a hole as collected by the first electrode layer 56 via the connecting part 54. The connecting part 54 is electrically insulated from other parts than the first electrode layer 56 and the p+ region 43 by an insulating layer 51.

The p+ region 45 is electrically connected to the first electrode layer 60 via a connecting part 53 as formed in an opening which is opened in the insulating layer 48, the R photoelectric conversion part and the insulating layer 59 and stores a hole as collected by the first electrode layer 60 via the connecting part 53. The connecting part 53 is electrically insulated from other parts than the first electrode layer 60 and the p+ region 45 by an insulating layer 50.

The p+ region 47 is electrically connected to the first electrode layer 64 via a connecting part 52 as formed in an opening which is opened in the insulating layer 48, the R photoelectric conversion part, the insulating layer 59, the B photoelectric conversion part and the insulating layer 63 and stores a hole as collected by the first electrode layer 64 via the connecting part 52. The connecting part 52 is electrically insulated from other parts than the first electrode layer 64 and the p+ region 47 by an insulating layer 49.

The hole as stored in the p region 43 is converted into a signal corresponding to the amount of a charge thereof by an MOS circuit (not illustrated) which is made of a p-channel MOS transistor as formed within the n region 42; the hole as stored in the p+ region 45 is converted into a signal corresponding to the amount of a charge thereof by an MOS circuit (not illustrated) which is made of a p-channel MOS transistor as formed within the n region 44; and the hole as stored in the p+ region 47 is converted into a signal corresponding to the amount of a charge thereof by an MOS circuit (not illustrated) which is made of a p-channel MOS transistor as formed within the n region 46, which is then outputted into the outside of the solid-state imaging device 300. These MOS circuits configure a signal read-out part as set forth in the appended claims. Each of the MOS circuits is connected to a non-illustrated signal read-out pad by a wiring 55. Incidentally, the signal read-out part may be configured of CCD and an amplifier but not an MOS circuit. In other words, the signal read-out part may be configured such that the hole as stored in the p+ region 43, 45, 47 is read out by CCD as formed within the silicon substrate 41 and transferred into an amplifier by CCD, from which is then outputted a signal corresponding to the hole.

Incidentally, it is also possible to form an inorganic photoelectric conversion part capable of receiving light which has transmitted through the photoelectric conversion layers 57, 61, 65, generating a charge corresponding to the light and storing the charge, which is made of an inorganic material, between the silicon substrate 41 and the first electrode layer 56 (for example, between the insulating layer 48 and the silicon substrate 41). In this case, it is only required that an MOS circuit for reading out a signal corresponding to the charge as stored in a charge storage region of this inorganic photoelectric conversion, part is provided within the silicon substrate 41 and that the wiring 55 is connected to this MOS circuit, too.

In this way, the configuration in which plural photoelectric conversion layers are stacked on a silicon substrate as mentioned in the first embodiment and second embodiment can be realized by the configuration as illustrated in FIG. 4.

In the foregoing description, the "photoelectric conversion layer capable of absorbing B light" as referred to herein means a photoelectric conversion layer which is able to absorb at least light of from 400 to 500 nm and preferably has an absorptance of a peak wavelength in that wavelength region of 50% or more. The "photoelectric conversion layer capable of absorbing G light" as referred to herein means a photoelectric conversion layer which is able to absorb at least light of from 500 to 600 nm and preferably has an absorptance of a peak wavelength in that wavelength region of 50% or more. The "photoelectric conversion layer capable of absorbing R light" as referred to herein means a photoelectric conversion layer which is able to absorb at least light of from 600 to 700 nm and preferably has an absorptance of a peak wavelength in that wavelength region of 50% or more.

Figure 7:
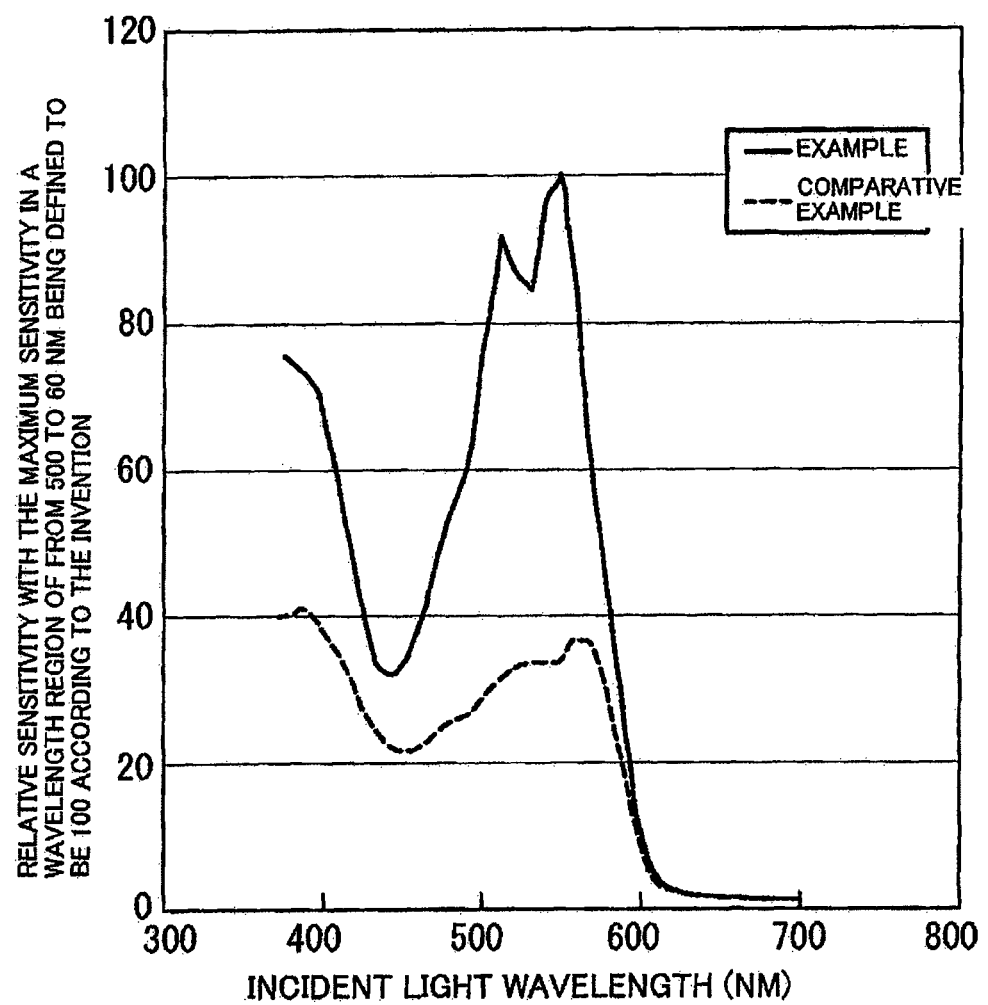
FIG. 7 is a graph to show the results of the Examples of the invention.

In the case of the configurations as in the first embodiment and third embodiment, patterns for detecting colors in the order of BGR, BRG, GBR, GRB, RBG or RGB from the upper layer can be thought. It is preferable that the uppermost layer is a G layer. Furthermore, in the case of the configuration as in the second embodiment, when the upper layer is an R layer, the lower layer can be a combination of a B layer and a G layer as formed in the same planar state; when the upper layer is a B layer, the lower layer can be a combination of a G layer and an R layer as formed in the same planar state; and when the upper layer is a G layer, the lower layer can be a combination of a B layer and an R layer as formed in the same planar state. Of these, a configuration as illustrated in FIG. 7 in which the upper layer is a G layer and the lower layer is a combination of a B layer and an R layer as formed in the same planar state is preferable.

Fourth Embodiment

Figure 5:
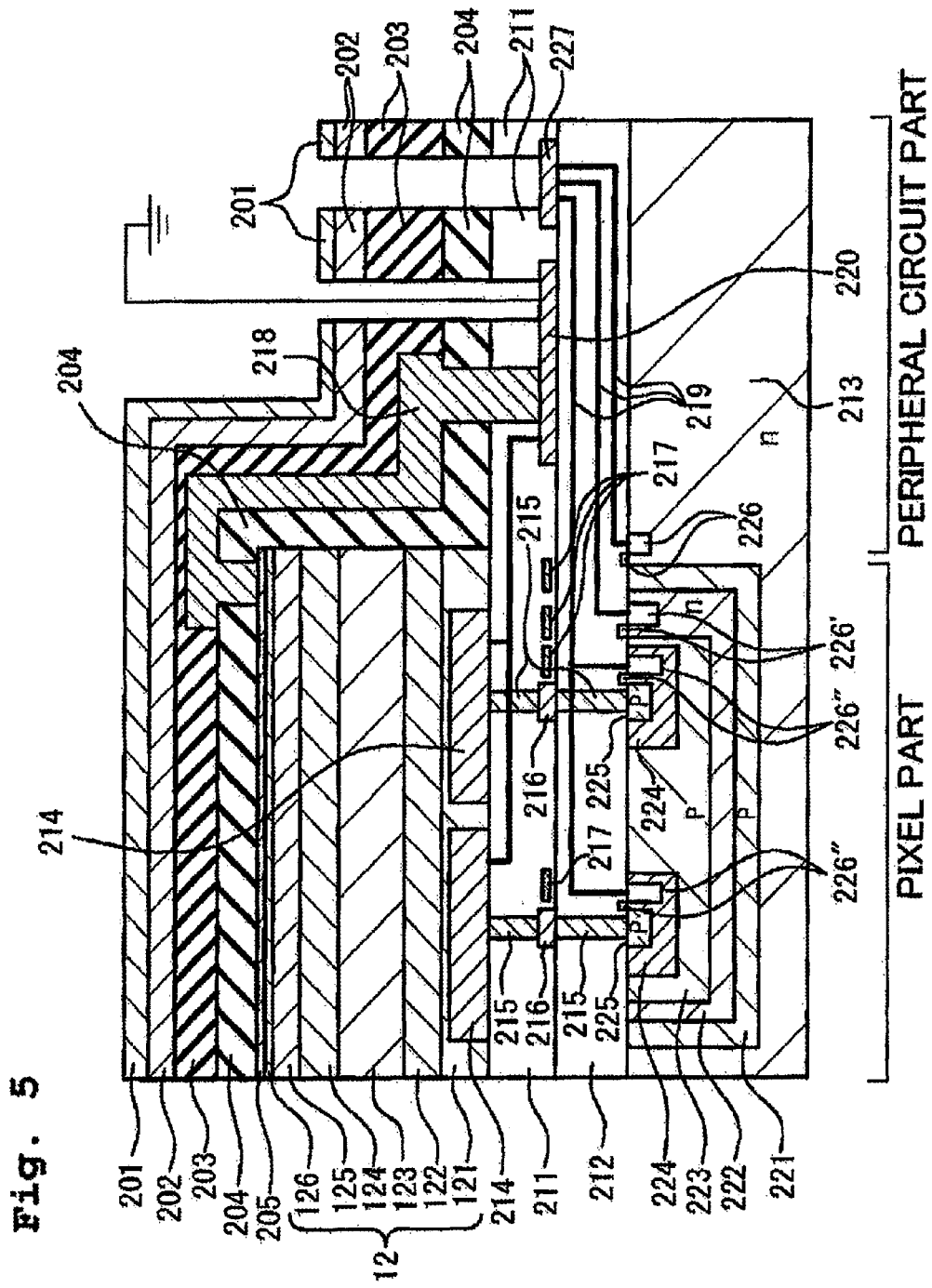
FIG. 5 is a cross-sectional schematic view of a solid-state imaging device for explaining a fourth embodiment of the invention.

FIG. 5 is a cross-sectional schematic view of solid-state imaging device for explaining a fourth embodiment of the invention. FIG. 5 illustrates a cross section of a portion of two pixels in a pixel part which is a portion for detecting light and storing a charge along with a wiring which is connected to electrodes as located in the pixel part and a cross section of a peripheral circuit part which is a portion where a bonding PAD to be connected to the wiring.

In an n-type silicon substrate 213 of a pixel part, a p region 221 is formed in a surface part thereof; an n region 222 is formed in a surface part of the p region 221; a p region 223 is formed in a surface part of the n region 222; and an n region 224 is formed in a surface part of the p region 223.

The p region 221 stores a hole of a red (R) component which has been photoelectrically converted by the pn junction with the n-type silicon substrate 213. A potential change of the p region 221 as caused due to the storage of the hole of the R component is read out into a signal read-out PAD 227 from an MOS transistor 226 as formed in the n-type silicon substrate 213 via a metallic wiring 219 as connected thereto.

The p region 223 stores a hole of a blue (B) component which has been photoelectrically converted by the pn junction with the n region 222. A potential change of the p region 223 as caused due to the storage of the hole of the B component is read out into the signal read-out PAD 227 from an MOS transistor 226' as formed in the n region 222 via the metallic wiring 219 as connected thereto.

A hole storage region 225 which is made of a p region for storing a hole of a green (G) component as generated in the photoelectric conversion layer 123 as stacked in an upper part of the n-type silicon substrate 213 is formed within the n region 224. A potential change of the hole storage region 225 as caused due to the storage of the hole of the G component is read out into the signal read-out PAD 227 from an MOS transistor 226" as formed within the n region 224 via the metallic wiring 219 as connected thereto. Usually, the signal read-out PAD 227 is separately provided in every transistor from which each of the color components is read out.

Here, the p region, the n region, the transistor, the metallic wiring, and the like are schematically illustrated. However, the respective structures and the like are not limited thereto, and optimum structures are properly selected. Since the B light and the R light are distinguished from each other depending upon, the depth of the silicon substrate, it is important to select the depth of the pn junction, etc. from the surface of the silicon substrate and the doping concentration of each of impurities. For a CMOS circuit which becomes the signal read-out part, technologies which are employed for usual CMOS image sensors can be applied. A circuit configuration for reducing the number of transistors in the pixel part inclusive of a low noise read-out column amplifier and a CDS circuit can be applied.

A transparent insulating layer 212 containing, as the major component, silicon oxide, silicon nitride, etc. is formed on the n-type silicon substrate 213; and a transparent insulating layer 211 containing, as the major component, silicon oxide, silicon nitride, etc. is formed on the insulating layer 212. It is preferable that the thickness of the insulating layer 212 is thin as far as possible. The thickness of the insulating layer 212 is preferably not more than 5 µm, more preferably not more than 3 µm, further preferably not more than 2 µm, and still further preferably not more than 1 µm.

A plug 215 for electrically connecting a first electrode layer 214 to a p region 225 as the hole storage region, which contains, for example, tungsten as the major component, is formed within the insulating layers 211, 212; and the plug 215 is relayed and connected between the insulating layer 211 and the insulating layer 212 by a pad 216. As the pad 216, a substance containing aluminum as the major component is preferably used. The foregoing metallic wiring 219 and gate electrodes of the transistors 226, 226', 226", and so on are formed within the insulating layer 212. It is preferable that a barrier layer including the metallic wiring is provided. The plug 215 is provided in every pixel.

In order to prevent a noise as caused due to the generation of a charge by the pn junction between the n region 224 and the p region 225, a light-shielding layer 217 is provided within the insulating layer 211. As the light-shielding layer 217, a substance containing, as the major component, aluminum, tungsten, etc. is usually used. A bonding PAD 220 (PAD for supplying a power source from the outside) and the signal read-out PAD 227 are formed within the insulating layer 211, and a metallic wiring (not illustrated) for electrically connecting the bonding PAD 220 to the first electrode layer 214 as described later is formed, too.

The transparent first electrode layer 214 is formed on the plug 215 of each pixel within the insulating layer 211. The first electrode layer 214 is divided for every pixel, and a light receiving area is determined by the size thereof. A bias is applied to the first electrode layer 214 through a wiring from the bonding PAD 220. A structure in which by applying a negative bias to the first electrode layer 214 against a second electrode layer 205 as described later, a hole can be stored in the hole storage region 225 is preferable.

A photoelectric conversion layer 12 having the same structure as in FIG. 2 is formed on the first electrode layer 214, and the second electrode layer 205 is formed thereon.

A protective layer 204 having a function to protect the photoelectric conversion layer 12 and containing, as the major component, silicon nitride, etc. is formed on the second electrode layer 205. In the protective layer 204, an opening is formed in a position not overlapping with the first electrode layer 214 of the pixel part; and in the insulating layer 211 and the protective layer 204, an opening is formed in a part on the bonding PAD 220. Further, the second electrode layer 205 and the bonding PAD 220 as exposed by these two openings are electrically connected to each other; and a wiring 218 for giving a potential to the second electrode layer 205, which is made of aluminum, etc., is formed in the inside of the opening and on the protective layer 204. As a material of the wiring 218, aluminum-containing alloys such as Al—Si and Al—Cu alloys can be used, too.

A protective layer 203 for protecting the wiring 218 and containing, as the major component, silicon nitride, etc. is formed on the wiring 218; an infrared light-cutting dielectric multilayered layer 202 is formed on the protective layer 203; and an antireflection layer 201 is formed on the infrared light-cutting dielectric multilayered layer 202.

The first electrode layer 214 accomplishes a function the same as in the first electrode layer 11 as illustrated in FIG. 1. The second electrode layer 205 accomplishes a function the same as in the second electrode layer 13 as illustrated in FIG. 1.

According to the foregoing configuration, it is possible to detect lights of three colors of BGR in one pixel and undergo color imaging. According to the configuration of FIG. 5, common values of R and B are used in two pixels, and only a value of G is separately used. However, since the sensitivity to G is important in forming a pixel, it is possible to produce a good color image even in such a configuration.

The solid-state imaging device which has been described previously can be applied for imaging devices including a digital camera, a video camera, a facsimile, a scanner, and a copier. It is also applicable to optical sensors such as a biosensor and a chemical sensor.

Furthermore, examples of a material which is used in the insulating layers as described in the foregoing embodiments include metal oxides such as $SiOx$, $SiNx$, BSG, PSG, BPSG, $Al_2O_3$, MgO, GeO, NiO, CaO, BaO, $Fe_2O_3$, $Y_2O_3$, and $TiO_2$; and metal fluorides such as $MgF_2$, LiF, $AlF_3$, and $CaF_2$. Of these materials, $SiOx$, $SiNx$, BSG, PSG, and BPSG are the most preferable.

Incidentally, in the first embodiment to the fourth embodiment, for reading out a signal from the photoelectric conversion part other than the photoelectric conversion layer, any of a hole and an electron may be used. Namely, as described previously, there may be employed a configuration in which a hole is stored in the inorganic photoelectric conversion part which is provided between the semiconductor substrate and the photoelectric conversion part as stacked thereon or the photodiode as formed within the semiconductor substrate and a signal corresponding to this hole is read out by the signal read-out part; and a configuration in which an electron is stored in the inorganic photoelectric conversion part or the photodiode as formed within the semiconductor substrate and a signal corresponding to this electron is read out by the signal read-out part.

EXAMPLES

The invention will be described below with reference to the following Examples, but it should not be construed that the invention is limited thereto.

Example

As the photoelectric conversion part, a configuration as illustrated in FIG. 2 was prepared in, the following manner; light was made incident from an upper part of the second electrode layer 13; a hole was collected by the first electrode layer 11; and a signal corresponding to the collected hole was read out by an MOS circuit. Then, a relative sensitivity with the maximum sensitivity in a wavelength region of from 500 to 60 nm being defined, to be 100 and a standardized relative sensitivity with the maximum sensitivity in a wavelength region of from 500 to 600 nm being defined to be 100 were determined.

As the first electrode layer 11, ITO having a thickness of 100 nm is deposited on a glass substrate by a sputtering method. As the electron blocking layer 122, m-MTDATA is deposited thereon in a thickness of 50 nm by a vacuum vapor deposition method. As the photoelectric conversion layer 123 capable of absorbing green light, quinacridone is deposited thereon in a thickness of 100 nm by a vacuum vapor deposition method; as the hole blocking layer 124, Alq3 is deposited in a thickness of 50 nm by a vacuum vapor deposition method; and as the hole blocking and buffering layer 125, BCP is subsequently deposited thereon in a thickness of 20 nm by a vacuum vapor deposition method. For the purpose of adjusting a work function of the second electrode layer 13 suitably as an electron collecting electrode, In is deposited thereon in a thickness of 5 nm by a vacuum vapor deposition method. In addition, as the second electrode layer 13, ITO is deposited in a thickness of 10 nm under a plasma-free condition by a sputtering method. From the deposition of m-MTDATA to the sputtering deposition of ITO as the second electrode layer 13 are carried out consistently in vacuo without being exposed in the air. Chemical formulae of the materials as used herein will be enumerated below.

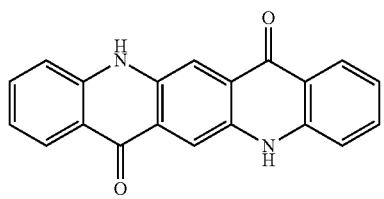

Quinacridone (5,12-dihydroquino[2,3-b]acridine-7,14-dione)

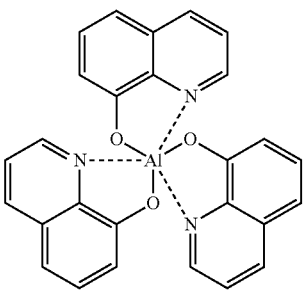

Alq3 (tris(8-hydroxyquinolinato)aluminum(III))

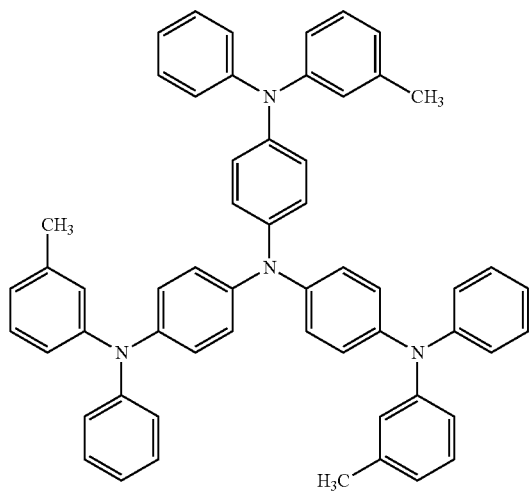

m-MTDATA (4,4',4"-tris(3methylphenylphenylamino)triphenylamine)

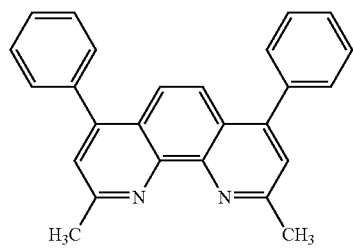

BCP (2,9-dimethyl-4,7-diphenyl-1,10-phenanthroline)

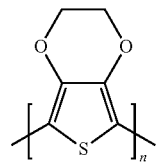

PEDOT (3,4-polyethylenedioxythiophene)

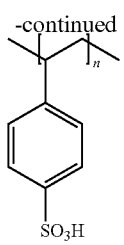

PSS (Polystyrenesulfonate)

Comparative Example

Figure 6:
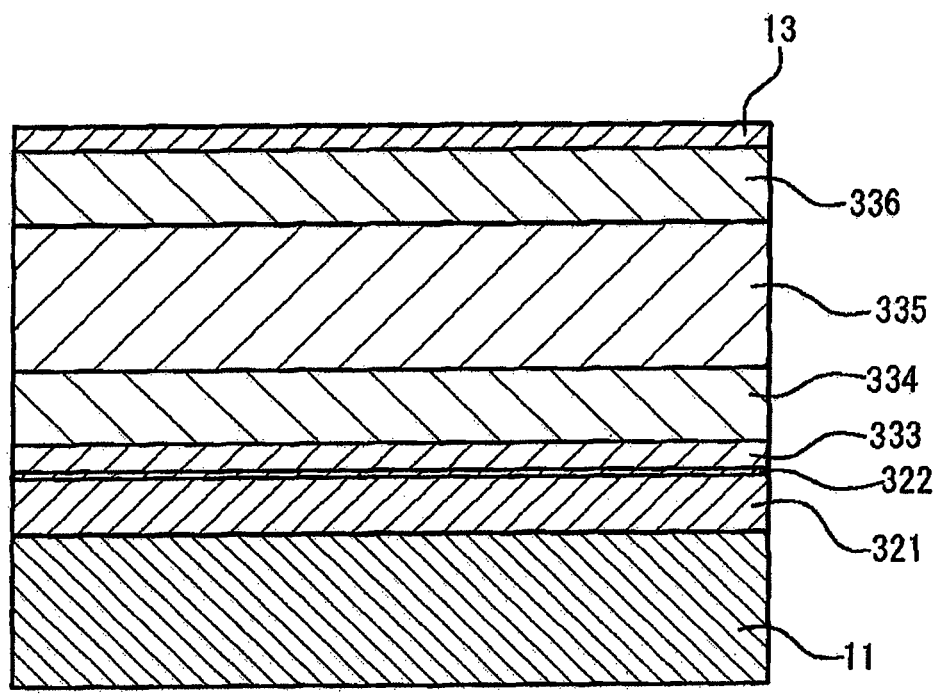
FIG. 6 is a cross-sectional schematic view of a photoelectric conversion part as prepared in the Examples of the invention.

As the photoelectric conversion part, a configuration as illustrated in FIG. 6 was prepared in the following manner; light was made incident from an upper part of the second electrode layer 13; a hole was collected by the first electrode layer 11; and a signal corresponding to the collected hole was read out by an MOS circuit. Then, a relative sensitivity with the maximum sensitivity in a wavelength region of from 500 to 60 nm being defined to be 100 and a standardized relative sensitivity with the maximum sensitivity in a wavelength region of from 500 to 600 nm being defined to be 100 were determined.

As the first electrode layer 11, ITO having a thickness of 100 nm is deposited on a glass substrate by a sputtering method. As a work function adjusting layer 322 for adjusting a work function of the first electrode layer 11 suitably as an electron collecting electrode, In is deposited thereon in a thickness of 2 nm by a vacuum vapor deposition method. As a hole blocking layer 333, BCP is deposited thereon in a thickness of 20 nm by a vacuum vapor deposition method. As an electron transporting photoelectric conversion layer 334 capable of absorbing green light, Alq3 is deposited thereon in a thickness of 50 nm by a vacuum vapor deposition method. As a hole transporting photoelectric conversion layer 335 capable of absorbing green light, quinacridone is deposited thereon in a thickness of 100 nm by a vacuum vapor deposition method. As an electron blocking layer 336, m-MTDATA is deposited thereon in a thickness of 50 nm by a vacuum vapor deposition method. As the second electrode layer 13, ITO is deposited thereon in a thickness of 10 nm under a plasma-free condition by a sputtering method. From the deposition of In to the sputtering deposition of ITO as the second electrode layer 13 are carried out consistently in vacuo without being exposed in the air.

Figure 8:
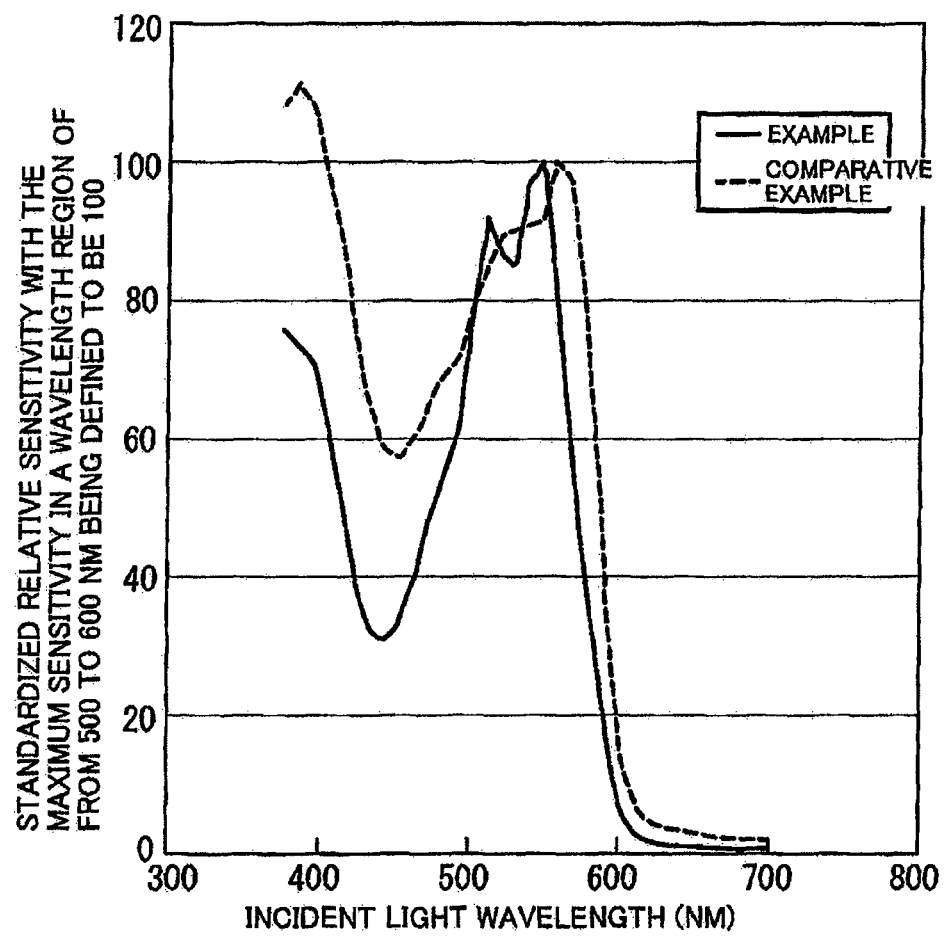
FIG. 8 is a graph to show the results of the Examples of the invention.

The relative sensitivity and the standardized relative sensitivity of each of the Example and the Comparative Example are shown in FIG. 7 and FIG. 8, respectively.

What is claimed is:
1. A photoelectric conversion device, comprising:
a photo-electric conversion part including a first electrode layer, a second electrode layer and a photoelectric conversion layer provided between the first electrode layer and the second electrode layer wherein
light is made incident from an upper part of the second electrode layer into the photoelectric conversion layer;
the photoelectric conversion layer generates a charge containing an electron and a hole corresponding to the incident light from the upper part of the second electrode layer;
the first electrode layer works as an electrode for extracting the hole and is separated in every pixel;

the second electrode layer works as an electrode for discharging the electron and is made common in every pixel; and the first electrode layer and the second electrode layer are applied with a voltage such that the electron transfers into the second electrode layer and that the hole transfers into the first electrode layer, the photoelectric conversion device further comprising:

a semiconductor substrate provided in a lower part of the first electrode layer;

a hole storage part that stores the holes as transferred into the first electrode layer and is formed within the semiconductor substrate; and a connecting part that electrically connects the hole storage part to the first electrode layer.

2. The photoelectric conversion device according to claim 1, wherein the photoelectric conversion layer generates the electron and the hole in larger amounts in a vicinity of the second electrode layer than those in a vicinity of the first electrode layer.

3. The photoelectric conversion device according to claim 1, wherein the photoelectric conversion layer contains an organic material.

4. The photoelectric conversion device according to claim 3, wherein the organic material contains at least one of an organic p-type semiconductor and an organic n-type semiconductor.

5. The photoelectric conversion device according to claim 1, wherein the first electrode layer is made from ITO, IZO, $ZnO_2$, $SnO_2$, $TiO_2$, FTO, Al, Ag, or Au.

6. The photoelectric conversion device according to claim 1, wherein the second electrode layer is made from ITO, IZO, $ZnO_2$, $SnO_2$, $TiO_2$, FTO, Al, Ag, or Au.

7. The photoelectric conversion device according to claim 1, wherein the first electrode layer has a light transmittance to visible light of 60% or more.

8. The photoelectric conversion device according to claim 1, further comprising:

a hole blocking layer between the photoelectric conversion layer and the second electrode; and an electron blocking layer between the photoelectric conversion layer and the first electrode.

9. The photoelectric conversion device according to claim 1, further comprising:

a hole blocking layer between the photoelectric conversion layer and the second electrode.

10. The photoelectric conversion device according to claim 1, further comprising:

an electron blocking layer between the photoelectric conversion layer and the first electrode.

* * * * *